US005725971A

United States Patent [19]

Moriuchi et al.

[11] Patent Number: 5,725,971
[45] Date of Patent: Mar. 10, 1998

[54] METHOD OF MANUFACTURING PHASE SHIFT MASKS AND A METHOD OF MANUFACTURING SEMICONDUCTOR INTEGRATED CIRCUIT DEVICES

[75] Inventors: Noboru Moriuchi, Oume; Seiichirou Shirai, Hamura; Toshihiko Onozuka, Oume, all of Japan

[73] Assignee: Hitachi, Ltd., Tokyo, Japan

[21] Appl. No.: 600,736

[22] Filed: Feb. 13, 1996

[30] Foreign Application Priority Data

Feb. 27, 1995 [JP] Japan .................... 7-037994
Nov. 15, 1995 [JP] Japan .................... 7-297106

[51] Int. Cl.$^6$ .................................................. G03F 9/00
[52] U.S. Cl. .................................................. 430/5; 430/311
[58] Field of Search ...................... 430/5, 311; 355/53, 355/69

[56] References Cited

U.S. PATENT DOCUMENTS

| | | | |
|---|---|---|---|
| 5,411,823 | 5/1995 | Okamoto et al. | 430/5 |
| 5,436,095 | 7/1995 | Mizuno et al. | 430/5 |
| 5,441,834 | 8/1995 | Takekuma et al. | 430/5 |
| 5,565,285 | 10/1996 | Takekuma et al. | 430/5 |

FOREIGN PATENT DOCUMENTS 62-67514  3/1987  Japan .

OTHER PUBLICATIONS

"I-Line Lithography and Phase Shifting Technique," Proceedings of SEMI. Technology Symposium (Mar. 1992) pp. 17–21.

Primary Examiner—S. Rosasco
Attorney, Agent, or Firm—Antonelli, Terry, Stout, & Kraus, LLP

[57] ABSTRACT

A technique to minimize an increase in the design and manufacture times required for making phase shift masks is provided. The process of the technique involves preparing a hole unit cell comprising one target hole and auxiliary holes located close to the four sides of the target hole, and then laying out on first layout data first hole unit cells $26c_1$–$26c_3$ arranged in a certain orientation at a first pitch and second hole unit cells $27c_1$–$27c_3$ arranged in the same orientation at a second pitch, narrower than the first pitch. This process generates data of hole groups, each comprising the target hole and auxiliary holes on a first phase shift mask that is used in forming hole patterns in a resist film coated over the semiconductor substrate.

19 Claims, 31 Drawing Sheets

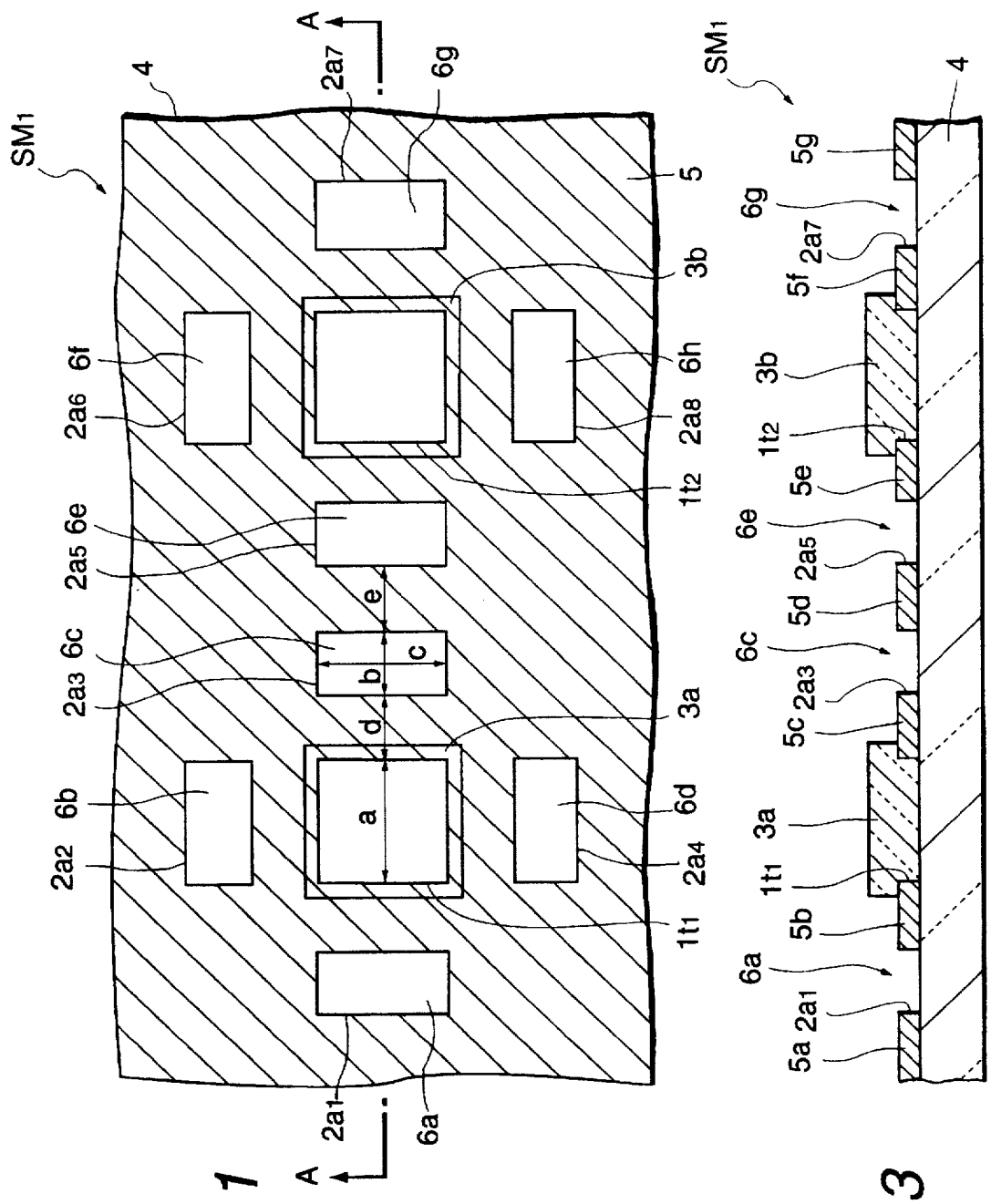

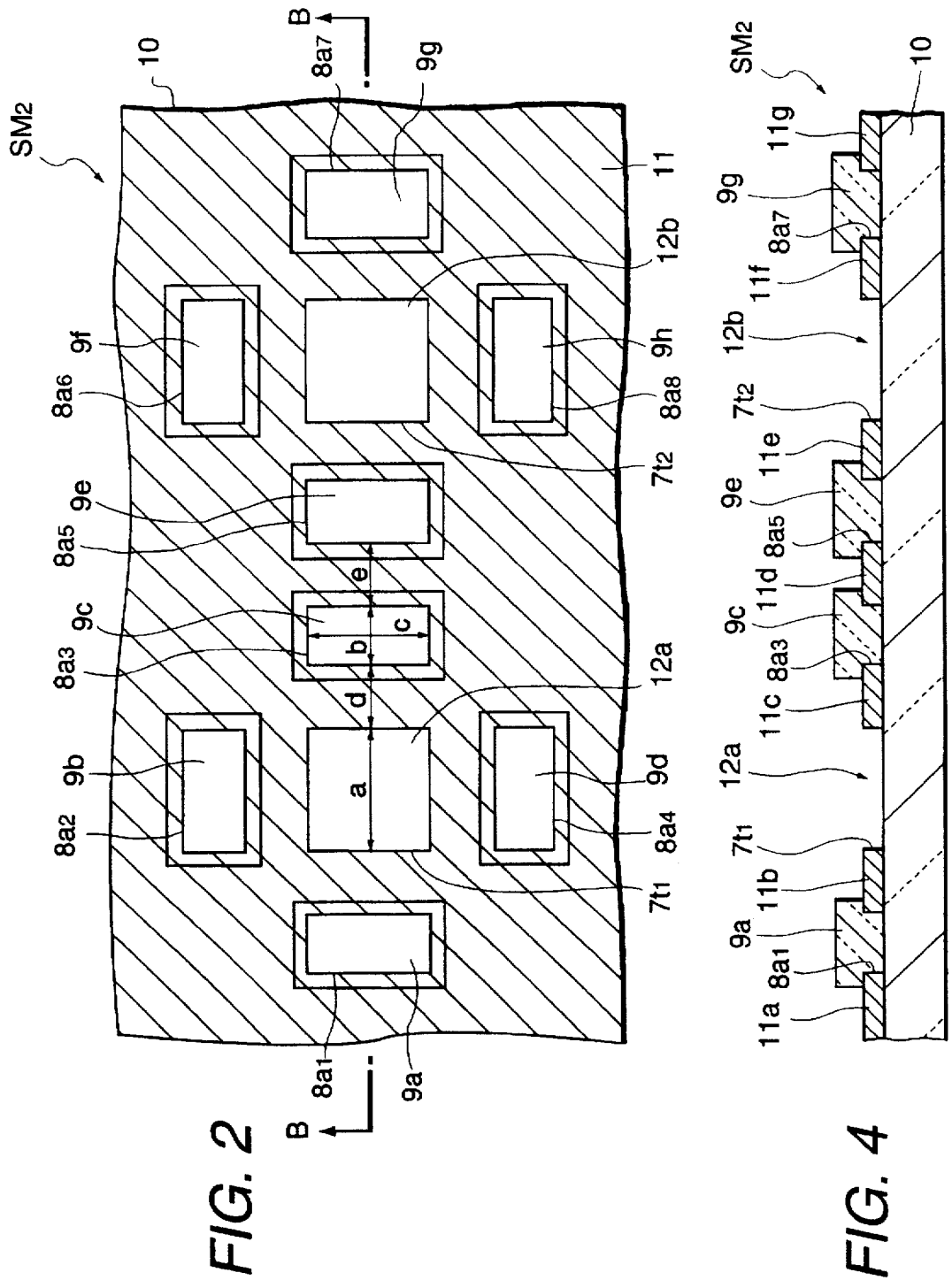

26c₁~26c₃ : 1ST HOLE UNIT CELLS
27c₁~27c₃ : 1ST HOLE UNIT CELLS
28t₁~28t₆ : TARGET HOLES
29a₁~29a₂₄ : AUXILIARY HOLES

METHOD OF MANUFACTURING PHASE SHIFT MASKS AND A METHOD OF MANUFACTURING SEMICONDUCTOR INTEGRATED CIRCUIT DEVICES

BACKGROUND OF THE INVENTION

The present invention relates to an exposure technique and more particularly to a technology that can be suitably applied to a phase shift mask manufacturing technique used in an exposure process—a part of the semiconductor integrated circuit device making process—and to a semiconductor integrated circuit pattern transfer technique using the phase shift mask manufacturing technique.

In ULSIs (Ultra-Large Scale Integrated Circuits), formation of hole patterns 0.3–0.4 μm in diameter is essential.

With a photolithography processing which utilizes light to transfer a desired pattern in a mask onto a resist film coated over a semiconductor substrate, however, as the target holes in the mask decrease in size, it becomes difficult to produce a sharp change in light intensity on the resist film even when an i-line with a short wavelength ($\lambda$=0.365 μm) is used. This in turn makes it difficult to transfer the target holes in the mask onto the resist film over the semiconductor substrate with high precision.

One of the means to improve this situation is a phase shift technique, in which light is passed through a pair of light transmitting areas, which sandwich a light-shielding area on a mask, to produce a phase difference between the rays of light so that these rays cancel each other out on an area of the resist film that is intended to be the light-shielding area, thereby producing a sharp change in light intensity on the resist film.

A method of forming hole patterns in a resist film over a semiconductor substrate by using this phase shift technique is described, for example, in Japan Patent Laid-Open No. 67514/1987.

That is, a part of the light-shielding area on the mask is removed to form a target hole, after which a phase shift film (shifter) is applied to either the target hole or the light transmitting area formed nearby to cause a phase difference between the light that has passed through the target hole and the light that has passed through the light transmitting area, so as to prevent the intensity distribution of light, which has passed through the target hole, from diffusing horizontally.

In the "I-Line Lithography and Phase Shifting Technique," Proceedings of SEMI (Semiconductor Equipment and Materials International) Technology Symposium 92, 1992, p17–p21, there is a description about a phase shift mask, which consists of target holes formed by removing a part of the light-shielding area of the mask and a group of light transmitting areas (auxiliary holes) located near the four sides of each of the target holes and provided with a shifter. It explains about an optimum design of length and width of the auxiliary holes that assures a sharp change in light intensity and a large focal depth on the resist film.

BRIEF SUMMARY OF THE INVENTION

The inventor of this invention found the following problems experienced when forming fine hole patterns in a resist film coated over a semiconductor substrate by using the above-mentioned phase shift technique and phase shift mask.

(1) In forming a number of hole patterns in the resist film over the semiconductor substrate by using a phase shift mask, enormous amounts of data and mask exposure data are entered, respectively, into a pattern data generation system that performs generation and verification of mask pattern data and into an electron beam exposure system that exposes a mask pattern onto the mask blank, requiring a large amount of time to make a phase shift mask.

That is, in conventional masks without auxiliary holes, only one target hole needs to be formed in the mask blank for each hole pattern formed in the resist film over the semiconductor substrate.

Hence, one hole pattern to be formed in the resist film over the semiconductor substrate requires one data to be entered into the pattern data generation system and one mask exposure data to be fed into the electron beam exposure system.

With a phase shift mask $SM_1$ with auxiliary holes as shown in FIG. 1, on the other hand, for one hole pattern formed in the resist film over the semiconductor substrate, there need to be formed one target hole $1t_1$ ($1t_2$), four auxiliary holes $2a_1$–$2a_4$ ($2a_5$–$2a_8$), and one shifter $3a$ ($3b$) provided over the target hole $1t_1$ ($1t_2$). In the figure, reference numeral 4 represents a mask blank, 5 a light-shielding film, and $6a$–$6h$ exposed portions of the mask blank.

Therefore, for one hole pattern formed in the resist film over the semiconductor substrate, the number of data to be entered into the pattern data generation system and the number of mask exposure data to be entered into the electron beam exposure system are six each.

While the phase shift mask $SM_1$ shown in FIG. 1 has the shifter $3a$ ($3b$) provided over the target hole $1t_1$ ($1t_2$) to produce an optical phase difference, it is possible to provide shifters $9a$–$9d$ ($9e$–$9h$) over four auxiliary holes $8a_1$–$8a_4$ ($8a_5$–$8a_8$) arranged along the sides of a target hole $7t_1$ ($7t_2$) as in the case of a phase shift mask $SM_2$ shown in FIG. 2. FIG. 3 is a cross section of the phase shift mask $SM_1$ of FIG. 1 taken along the line A—A. FIG. 4 is a cross section of the phase shift mask $SM_2$ of FIG. 2 taken along the line B—B. Reference numerals $5a$–$5g$ denote light-shielding films, $9a$–$9h$ shifters, 10 a mask blank, 11 and $11a$–$11g$ light-shielding films, and $12a$ and $12b$ exposed portions of the mask blank.

(2) When the distances between adjacent target holes in the phase shift mask are shortened to form narrow-pitched hole patterns in a resist film over the semiconductor substrate, the intensity distributions of beams that have passed through two adjacent auxiliary holes, each belonging to different groups of auxiliary holes formed close to the four sides of adjacent target holes, overlap each other on the resist film, increasing the light intensity in the overlapping area and causing unwanted patterns to be transferred onto a region of the resist film over the semiconductor substrate that is originally intended to be a light-shielding area.

For example, when a hole pattern 0.4 μm in diameter is to be formed in a resist film over the semiconductor substrate by using the phase shift mask $SM_1$ of FIG. 1 and a ⅕ reduction projection aligner, the generation of a steep change in light intensity on the resist film requires the phase shift mask $SM_1$ to be designed in such a way that the target holes $1t_1$, $1t_2$ are square with each side a measuring 2.0 μm, that the auxiliary holes $2a_1$–$2a_8$ arranged parallel to the sides of the target holes $1t_1$, $1t_2$ are rectangular with the width b and length c measuring 1.0 μm and 2.0 μm, respectively, and that the distance d between the target hole and the auxiliary holes is 1.0 μm.

In the phase shift mask $SM_1$ having the target holes and auxiliary holes with the above dimensions, when the minimum distance e between adjacent auxiliary holes $2a_3$ and $2a_5$—which belong to different auxiliary hole groups arranged along the sides of adjacent target holes—becomes smaller than 1.0 µm, unwanted patterns, in addition to the hole patterns to be transferred, are transferred by these adjacent auxiliary holes onto what is originally intended to be a light-shielding area of the resist film deposited over the semiconductor substrate.

To prevent such unwanted pattern transfers, the minimum pitch p of the target holes in the phase shift mask $SM_1$ needs to be set as follows.

$$p=(a+2b+2d)+e$$
$$=6.0 \ \mu m+1.0 \ \mu m=7.0 \ \mu m \quad (1)$$

Because the ⅕ reduction aligner is used, the minimum pitch of the hole patterns formed in the resist film is one-fifth of 7.0 µm, or 1.4 µm.

In other words, although the use of the phase shift mask allows the hole patterns 0.4 µm in diameter to be formed on the resist film over the semiconductor substrate, the arrangement intervals between the hole patterns cannot be reduced below 1.4 µm.

Next, an SRAM (Static Random Access Memory) is taken for example and the problem (1) and (2) of the conventional technique are explained below.

FIG. 5 shows an equivalent circuit of an SRAM memory cell MC. The SRAM memory cell comprises a pair of drive MISFETs (Metal Insulator Semiconductor Field Effect Transistors) $0d_1$, $0d_2$, a pair of load MISFETs $0p_1$, $0p_2$, and a pair of transfer MISFETs $0t_1$, $0t_2$, all located at intersections between a pair of complementary data lines ($DL_1$, $DL_2$) and a word line WL, as shown in the figure. The drive MISFETs $0d_1$, $0d_2$ and the transfer MISFETs $0t_1$, $0t_2$ are formed of n-channel transistors, and the load MISFETs $0p_1$, $0p_2$ are made of p-channel transistors. That is, this memory cell is formed in a complete CMOS type using four n-channel MISFETs and two p-channel MISFETs.

FIG. 6 shows a pattern layout of the SRAM memory cell that is entered into the pattern data generation system as data when forming a conventional mask having no auxiliary holes.

In the figure, an active region AR, a gate electrode 13 (word line WL) of the transfer MISFETs $0t_1$, $0t_2$, and gate electrodes 14a, 14b of the drive MISFETs $0d_1$, $0d_2$ and load MISFETs $0p_1$, $0p_2$ in the memory cell are shown superimposed. The figure also shows target holes $15t_1$–$15t_{12}$ to form contact holes over the active region AR or the gate electrodes 14a, 14b.

The target holes $15t_1$–$15t_{12}$ are square with each side measuring 0.4 µm and one memory cell measures 4.2×6.8 µm.

In a conventional mask without auxiliary holes, the pattern required for forming one contact hole is one target hole and thus the number of data required to form the contact holes in one memory cell equals the number of target hole data or 12.

FIG. 7 shows a pattern layout of an SRAM memory cell that is entered into the pattern data generation system as data when forming a phase shift mask having auxiliary holes.

As in the case of FIG. 6, FIG. 7 shows an active region AR, a gate electrode 13 (word line WL) of the transfer MISFETs $0t_1$, $0t_2$, and gate electrodes 14a, 14b of the drive MISFETs $0d_1$, $0d_2$ and load MISFETs $0p_1$, $0p_2$ in the memory cell are shown superimposed. Further, the figure shows target holes $15t_1$–$15t_{12}$ to form contact holes over the active region AR or the gate electrodes 14a, 14b and also auxiliary holes $16a_1$–$16a_{48}$ arranged parallel to the sides of the target holes $15t_1$–$15t_{12}$.

The target holes $15t_1$–$15t_{12}$ are square measuring 0.4 µm on each side, and the auxiliary holes $16a_1$–$16a_{48}$ are rectangular measuring 0.4×0.2 µm. The size of one memory cell is 4.2×6.8 µm.

With the phase shift mask having auxiliary holes, the pattern required to form one contact hole includes one target hole, four auxiliary holes and at least one shifter. Hence, the number of data needed to form the contact holes in one memory cell is the sum of 12 data on target holes, 48 data on auxiliary holes and 12 data on shifters, which amounts to 72 in total, at least 6 times the number of data required by the conventional mask without auxiliary holes.

As shown in circles of FIG. 7, if the target holes are arranged at intervals of less than 1.3 µm, the distance between the adjacent auxiliary holes, which belong to different auxiliary hole groups arranged close to the sides of adjacent target holes, becomes so short that these adjacent auxiliary holes may be connected. Hence, when a mask pattern of FIG. 7 having the target holes and auxiliary holes is transferred onto the resist film over the semiconductor substrate by using a phase shift mask with such a mask pattern, unwanted patterns, in addition to the hole patterns to be transferred, are transferred onto what will be a light-shielding area of the resist film over the semiconductor substrate.

To prevent such transfers of unwanted patterns onto the resist film over the semiconductor substrate, it is a common practice to design the shape and size of the auxiliary holes according to the intervals of the target holes that have already been arranged. This method, however, increases the design time significantly.

An object of this invention is to provide a technique that can limit an increase in the design and manufacture time for making a phase shift mask.

Another object of this invention is to provide a technique that can promote higher level of integration of semiconductor integrated circuit devices.

These and other objects and novel features of this invention will become apparent from the following description in this specification as well as the accompanying drawings.

Means of Solving the Problems

Representative aspects of this invention may be briefly summarized as follows.

(1) The method of manufacturing a phase shift mask used in making semiconductor integrated circuit devices according to this invention has the following processes:

(A) a first hole distribution area layout process to lay out a first hole distribution area made up of a number of hole groups corresponding to first hole patterns arranged on a wafer at a first pitch, by laying out first hole unit cells on first layout data for a first phase shift mask through computer processing, the first hole unit cells corresponding to the hole groups on the main surface of the mask, each hole group comprising one target hole and auxiliary holes located close to the four sides of the target hole, the auxiliary holes being inverted in phase from the target hole;

(B) a second hole distribution area layout process to lay out a second hole distribution area made up of a number of hole groups corresponding to second hole patterns arranged close together on the wafer at a second pitch, narrower than the first pitch, by laying out the first hole unit cells on the first layout data for the first phase shift mask through computer processing in such a way that longitudinal sides or lateral sides of a pair of auxiliary holes belonging to a pair of most closely arranged hole groups do not face each other at very close distance; and (C) a first hole distribution area exposing process to expose the first and second hole distribution areas onto the main surface of the first phase shift mask according to the completed first layout data or according to first mask exposure data generated from the first layout data.

(2) In the method of this invention for manufacturing a phase shift mask used in making semiconductor integrated circuit devices according to the above method (1), the hole groups in the first hole distribution area and the hole groups in the second hole distribution area are arranged in the same orientation.

(3) In the method of this invention for manufacturing a phase shift mask used in making semiconductor integrated circuit devices according to the above method (2), the pair of auxiliary holes that belong to the pair of the most closely arranged hole groups in the second hole distribution area are arranged in such a way that line sections connecting the centers of the pair of the auxiliary holes face each other at the front.

(4) In the method of this invention for manufacturing a phase shift mask used in making semiconductor integrated circuit devices according to the above method (3), the target hole is a square and the auxiliary holes are rectangles arranged so that their longer sides extend along the sides of the target hole.

(5) In the method of this invention for manufacturing a phase shift mask used in making semiconductor integrated circuit devices according to the above method (4), the first hole patterns are arranged close to each other on the wafer.

(6) The method of manufacturing a phase shift mask used in making semiconductor integrated circuit devices according to this invention has the following processes:

(A) a first hole distribution area layout process to lay out a first hole distribution area made up of a number of hole groups corresponding to first hole patterns arranged on a wafer at a first pitch, by laying out first hole unit cells on first layout data for a first phase shift mask through computer processing, the first hole unit cells corresponding to the hole groups on the main surface of the mask, each hole group comprising one target hole and auxiliary holes located close to the four sides of the target hole, the auxiliary holes being inverted in phase from the target hole;

(B) a second hole distribution area layout process to lay out a second hole distribution area made up of a number of hole groups corresponding to second hole patterns arranged close together on the wafer at a second pitch, narrower than the first pitch, by laying out the first hole unit cells on second layout data for a second phase shift mask through computer processing in such a way that longitudinal sides or lateral sides of a pair of auxiliary holes belonging to a pair of most closely arranged hole groups do not face each other at very close distance;

(C) a first hole distribution area exposing process to expose the first hole distribution area onto the main surface of the first phase shift mask according to the completed first layout data or according to first mask exposure data generated from the first layout data; and (D) a second hole distribution area exposing process to expose the second hole distribution area onto the main surface of the second phase shift mask according to the completed second layout data or according to second mask exposure data generated from the second layout data.

(7) In the method of this invention for manufacturing a phase shift mask used in making semiconductor integrated circuit devices according to the above method (6), the hole groups in the first hole distribution area and the hole groups in the second hole distribution area are arranged in the same orientation.

(8) In the method of this invention for manufacturing a phase shift mask used in making semiconductor integrated circuit devices according to the above method (7), the pair of auxiliary holes that belong to the pair of the most closely arranged hole groups in the second hole distribution area are arranged in such a way that line sections connecting the centers of the pair of the auxiliary holes face each other at the front.

(9) In the method of this invention for manufacturing a phase shift mask used in making semiconductor integrated circuit devices according to the above method (8), the target hole is a square and the auxiliary holes are rectangles arranged so that their longer sides extend along the sides of the target hole.

(10) In the method of this invention for manufacturing a phase shift mask used in making semiconductor integrated circuit devices according to the above method (9), the first hole patterns are arranged close to each other on the wafer.

(11) The method of manufacturing a semiconductor integrated circuit devices according to this invention has the following processes:

(A) a first hole distribution area layout process to lay out a first hole distribution area made up of a number of hole groups corresponding to first hole patterns arranged on a wafer at a first pitch, by laying out first hole unit cells on first layout data for a first phase shift mask through computer processing, the first hole unit cells corresponding to the hole groups on the main surface of the mask, each hole group comprising one target hole and auxiliary holes located close to the four sides of the target hole, the auxiliary holes being inverted in phase from the target hole;

(B) a second hole distribution area layout process to lay out a second hole distribution area made up of a number of hole groups corresponding to second hole patterns arranged close together on the wafer at a second pitch, narrower than the first pitch, by laying out the first hole unit cells on the first layout data for the first phase shift mask through computer processing in such a way that longitudinal sides or lateral sides of a pair of auxiliary holes belonging to a pair of most closely arranged hole groups do not face each other at very close distance;

(C) a first hole distribution area exposing process to expose the first and second hole distribution areas onto the main surface of the first phase shift mask according to the completed first layout data or according to first mask exposure data generated from the first layout data; and (D) a first exposing process to transfer the first and second hole patterns onto the wafer by a reduction projection exposure using the completed first phase shift mask.

(12) In the method of this invention for manufacturing a semiconductor integrated circuit devices according to the above method (11), the hole groups in the first hole distribution area and the hole groups in the second hole distribution area are arranged in the same orientation.

(13) In the method of this invention for manufacturing a semiconductor integrated circuit devices according to the above method (12), the pair of auxiliary holes that belong to the pair of the most closely arranged hole groups in the second hole distribution area are arranged in such a way that line sections connecting the centers of the pair of the auxiliary holes face each other at the front.

(14) In the method of this invention for manufacturing a semiconductor integrated circuit devices according to the above method (13), the target hole is a square and the auxiliary holes are rectangles arranged so that their longer sides extend along the sides of the target hole.

(15) In the method of this invention for manufacturing a semiconductor integrated circuit devices according to the above method (14), the first hole patterns are arranged close to each other on the wafer.

(16) The method of manufacturing a semiconductor integrated circuit devices according to this invention has the following processes:

(A) a first hole distribution area layout process to lay out a first hole distribution area made up of a number of hole groups corresponding to first hole patterns arranged on a wafer at a first pitch, by laying out first hole unit cells on first layout data for a first phase shift mask through computer processing, the first hole unit cells corresponding to the hole groups on the main surface of the mask, each hole group comprising one target hole and auxiliary holes located close to the four sides of the target hole, the auxiliary holes being inverted in phase from the target hole;

(B) a second hole distribution area layout process to lay out a second hole distribution area made up of a number of hole groups corresponding to second hole patterns arranged close together on the wafer at a second pitch, narrower than the first pitch, by laying out the first hole unit cells on second layout data for a second phase shift mask through computer processing in such a way that longitudinal sides or lateral sides of a pair of auxiliary holes belonging to a pair of most closely arranged hole groups do not face each other at very close distance;

(C) a first hole distribution area exposing process to expose the first hole distribution area onto the main surface of the first phase shift mask according to the completed first layout data or according to first mask exposure data generated from the first layout data;

(D) a second hole distribution area exposing process to expose the second hole distribution area onto the main surface of the second phase shift mask according to the completed second layout data or according to second mask exposure data generated from the second layout data.

(E) a first exposing process to transfer the first hole patterns onto the wafer by a reduction projection exposure using the completed first phase shift mask; and (F) a second exposing process to transfer the second hole patterns onto the wafer by a reduction projection exposure using the completed second phase shift mask.

(17) In the method of this invention for manufacturing a semiconductor integrated circuit devices according to the above method (16), the hole groups in the first hole distribution area and the hole groups in the second hole distribution area are arranged in the same orientation.

(18) In the method of this invention for manufacturing a semiconductor integrated circuit devices according to the above method (17), the pair of auxiliary holes that belong to the pair of the most closely arranged hole groups in the second hole distribution area are arranged in such a way that line sections connecting the centers of the pair of the auxiliary holes face each other at the front.

(19) In the method of this invention for manufacturing a semiconductor integrated circuit devices according to the above method (18), the target hole is a square and the auxiliary holes are rectangles arranged so that their longer sides extend along the sides of the target hole.

(20) In the method of this invention for manufacturing a semiconductor integrated circuit devices according to the above method (19), the first hole patterns are arranged close to each other on the wafer.

Other aspects of this invention may be briefly summarized as follows.

1. The method of manufacturing a phase shift mask used in making semiconductor integrated circuit devices according to this invention has the following steps of:

(a) preparing a hole unit cell which comprises a rectangular target hole and auxiliary holes located close to the sides of the target hole and which is capable of being repetitively placed at desired positions on layout data that are entered into a pattern data generation system;

(b) entering data on the target hole and the auxiliary holes into the pattern data generation system to generate target pattern data having the data on the target hole and auxiliary holes;

(c) entering data on the hole unit cell into the pattern data generation system to generate layout data having the data on the hole unit cell;

(d) entering data on shifter into the pattern data generation system to generate phase shift pattern data having the shifter data;

(e) according to the target and auxiliary hole data on the target pattern data, the hole unit cell data on the layout data and the shifter data on the phase shift pattern data, generating mask exposure data on the target hole and auxiliary holes, mask exposure data on the hole unit cell and mask exposure data on the shifter, and entering these mask exposure data into an electron beam aligner; and (f) generating hole groups on a mask blank according to the mask exposure data on the target hole and auxiliary holes and mask exposure data on the hole unit cell, and generating shifters on the mask blank according to the mask exposure data on the shifter.

2. In the method of this invention for manufacturing a phase shift mask used in making semiconductor integrated circuit devices according to the above method 1, the hole unit cell is commonly used on individual layout data used for particular manufacturing processes that is entered into the pattern data generation system.

3. In the method of this invention for manufacturing a phase shift mask used in making semiconductor integrated circuit devices according to the above method 2, the target holes are arranged so that each side of the target holes is at an angle of about 45 degrees to the direction of arrangement of adjacent target holes.

4. In the method of this invention for manufacturing a phase shift mask used in making semiconductor integrated circuit devices according to the above method 3, the auxiliary holes are polygons.

5. In the method of this invention for manufacturing a phase shift mask used in making semiconductor integrated circuit devices according to the above method 4, the auxiliary holes are placed in contact with the sides of the target hole.

6. The method of manufacturing a phase shift mask used in making semiconductor integrated circuit devices according to this invention has the following steps of:

(a) preparing a hole unit cell which comprises a rectangular target hole and auxiliary holes, the auxiliary holes being located close to the sides of the target hole in such a way that they will not be transferred onto the mask blank; and which is capable of being used commonly on individual layout data used for particular manufacturing processes that is entered into a pattern data generation system, and which is also capable of being repetitively placed at desired locations on the layout data;

(b) entering data on the target hole and the auxiliary holes into the pattern data generation system to generate target pattern data having the data on the target hole and auxiliary holes;

(c) entering data on the hole unit cell into the pattern data generation system to generate layout data having the data on the hole unit cell;

(d) entering data on shifter into the pattern data generation system to generate phase shift pattern data having the shifter data;

(e) according to the target and auxiliary hole data on the target pattern data, the hole unit cell data on the layout data and the shifter data on the phase shift pattern data, generating mask exposure data on the target hole and auxiliary holes entered into an electron beam aligner, mask exposure data on the hole unit cell and mask exposure data on the shifter; and (f) generating hole groups on a mask blank according to the mask exposure data on the target hole and auxiliary holes and mask exposure data on the hole unit cell, and generating shifters on the mask blank according to the mask exposure data on the shifter.

7. The method of manufacturing a phase shift mask used in making semiconductor integrated circuit devices according to this invention has the following steps of:

(a) preparing a hole unit cell which comprises a rectangular target hole and auxiliary holes located close to the sides of the target hole, the target hole being arranged so that the sides of the target hole are at an angle of 45 degrees to the direction of arrangement of adjacent target holes; and which is capable of being used commonly on individual layout data used for particular manufacturing processes that is entered into a pattern data generation system, and which is also capable of being repetitively placed at desired locations on the layout data;

(b) preparing several size-differing groups of target hole and auxiliary holes, several size-differing unit cells, each comprising a group of the target hole and auxiliary holes of corresponding size, and several size-differing shifters;

(c) selecting a desired group of target hole and auxiliary holes from the several size-differing groups of target hole and auxiliary holes, and entering data on the selected hole group into the pattern data generation system to generate target pattern data having the data on the selected hole group;

(d) selecting a desired hole unit cell from the several size-differing hole unit cells and entering data on the selected hole unit cell into the pattern data generation system to generate layout data having the data on the selected hole unit cell;

(e) selecting a desired shifter from the several size-differing shifters and entering data on the selected shifter into the pattern data generation system to generate phase shift pattern data having the data on the selected shifter;

(f) according to the data on the selected group of target hole and auxiliary holes on the target pattern data, the data on the selected hole unit cell on the layout data and the data on the selected shifter on the phase shift pattern data, generating mask exposure data on the selected group of target hole and auxiliary holes, mask exposure data on the selected hole unit cell and mask exposure data on the selected shifter, and entering these mask exposure data into an electron beam aligner; and (g) forming hole groups on a mask blank according to the mask exposure data on the selected group of target hole and auxiliary holes and the mask exposure data on the selected hole unit cell, and forming shifters on the mask blank according to the mask exposure data on the selected shifter.

8. In the method of this invention for manufacturing a phase shift mask used in making semiconductor integrated circuit devices according to the above method 7, the auxiliary holes are polygons.

9. In the method of this invention for manufacturing a phase shift mask used in making semiconductor integrated circuit devices according to the above method 8, the auxiliary holes are placed in contact with the sides of the target hole.

10. The method of manufacturing a phase shift mask used in making semiconductor integrated circuit devices according to this invention has the following steps of:

(a) preparing a hole unit cell which comprises a rectangular target hole and auxiliary holes, the auxiliary holes being located close to the sides of the target hole in such a way that they will not be transferred onto the mask blank; and which is capable of being used commonly on individual layout data used for particular manufacturing processes that is entered into a pattern data generation system, and which is also capable of being repetitively placed at desired locations on the layout data;

(b) preparing several size-differing groups of target hole and auxiliary holes, several size-differing unit cells, each comprising a group of the target hole and auxiliary holes of corresponding size, and several size-differing shifters;

(c) selecting a desired group of target hole and auxiliary holes from the several size-differing groups of target hole and auxiliary holes, and entering data on the selected hole group into the pattern data generation system to generate target pattern data having the data on the selected hole group;

(d) selecting a desired hole unit cell from the several size-differing hole unit cells and entering data on the selected hole unit cell into the pattern data generation system to generate layout data having the data on the selected hole unit cell;

(e) selecting a desired shifter from the several size-differing shifters and entering data on the selected shifter into the pattern data generation system to generate phase shift pattern data having the data on the selected shifter;

(f) according to the data on the selected group of target hole and auxiliary holes on the target pattern data, the data on the selected hole unit cell on the layout data and the data on the selected shifter on the phase shift pattern data, generating mask exposure data on the selected group of target hole and auxiliary holes, mask exposure data on the selected hole unit cell and mask exposure data on the selected shifter, and entering these mask exposure data into an electron beam aligner; and (g) forming hole groups on a mask blank according to the mask exposure data on the selected group of target hole and auxiliary holes and the mask exposure data on the selected hole unit cell, and forming shifters on the mask blank according to the mask exposure data on the selected shifter.

11. The method of manufacturing a semiconductor integrated circuit device according to this invention has the following steps of:

(a) preparing a hole unit cell which comprises a rectangular target hole and auxiliary holes located close to the sides of the target hole and which is capable of being repetitively placed at desired positions on layout data that are entered into a pattern data generation system;

(b) entering data on the target hole and the auxiliary holes into the pattern data generation system to generate target pattern data having the data on the target hole and auxiliary holes;

(c) entering data on the hole unit cell into the pattern data generation system to generate layout data having the data on the hole unit cell;

(d) entering data on shifter into the pattern data generation system to generate phase shift pattern data having the shifter data;

(e) according to the target and auxiliary hole data on the target pattern data, the hole unit cell data on the layout data and the shifter data on the phase shift pattern data, generating mask exposure data on the target hole and auxiliary holes, mask exposure data on the hole unit cell and mask exposure data on the shifter, and entering these mask exposure data into an electron beam aligner;

(f) generating hole groups on a mask blank according to the mask exposure data on the target hole and auxiliary holes and mask exposure data on the hole unit cell, and generating shifters on the mask blank according to the mask exposure data on the shifter; and (g) transferring desired hole patterns onto a resist film coated over the surface of the semiconductor substrate by using a phase shift mask having the hole groups and the shifters.

12. In the method of this invention for manufacturing a semiconductor integrated circuit device according to the above method 11, the hole unit cell is commonly used on individual layout data used for particular manufacturing processes that is entered into the pattern data generation system.

13. In the method of this invention for manufacturing a semiconductor integrated circuit device according to the above method 12, the target holes are arranged so that each side of the target holes is at an angle of about 45 degrees to the direction of arrangement of adjacent target holes.

14. In the method of this invention for manufacturing a semiconductor integrated circuit device according to the above method 13, the auxiliary holes are polygons.

15. In the method of this invention for manufacturing a semiconductor integrated circuit device according to the above method 14, the auxiliary holes are placed in contact with the sides of the target hole.

16. The method of manufacturing a semiconductor integrated circuit device according to this invention has the following steps of:

(a) preparing a hole unit cell which comprises a rectangular target hole and auxiliary holes, the auxiliary holes being located close to the sides of the target hole in such a way that they will not be transferred onto the mask blank; and which is capable of being used commonly on individual layout data used for particular manufacturing processes that is entered into a pattern data generation system, and which is also capable of being repetitively placed at desired locations on the layout data;

(b) entering data on the target hole and the auxiliary holes into the pattern data generation system to generate target pattern data having the data on the target hole and auxiliary holes;

(c) entering data on the hole unit cell into the pattern data generation system to generate layout data having the data on the hole unit cell;

(d) entering data on shifter into the pattern data generation system to generate phase shift pattern data having the shifter data;

(e) according to the target and auxiliary hole data on the target pattern data, the hole unit cell data on the layout data and the shifter data on the phase shift pattern data, generating mask exposure data on the target hole and auxiliary holes, mask exposure data on the hole unit cell and mask exposure data on the shifter, and entering these mask exposure data into an electron beam aligner;

(f) generating hole groups on a mask blank according to the mask exposure data on the target hole and auxiliary holes and mask exposure data on the hole unit cell, and generating shifters on the mask blank according to the mask exposure data on the shifter; and (g) transferring desired hole patterns onto a resist film coated over the surface of the semiconductor substrate by using a phase shift mask having the hole groups and the shifters.

17. The method of manufacturing a semiconductor integrated circuit device according to this invention has the following steps of:

(a) preparing a hole unit cell which comprises a rectangular target hole and auxiliary holes located close to the sides of the target hole, the target hole being arranged so that the sides of the target hole are at an angle of 45 degrees to the direction of arrangement of adjacent target holes; and which is capable of being used commonly on individual layout data used for particular manufacturing processes that is entered into a pattern data generation system, and which is also capable of being repetitively placed at desired locations on the layout data;

(b) preparing several size-differing groups of target hole and auxiliary holes, several size-differing unit cells, each comprising a group of the target hole and auxiliary holes of corresponding size, and several size-differing shifters;

(c) selecting a desired group of target hole and auxiliary holes from the several size-differing groups of target hole and auxiliary holes, and entering data on the selected hole group into the pattern data generation system to generate target pattern data having the data on the selected hole group;

(d) selecting a desired hole unit cell from the several size-differing hole unit cells and entering data on the selected hole unit cell into the pattern data generation system to generate layout data having the data on the selected hole unit cell;

(e) selecting a desired shifter from the several size-differing shifters and entering data on the selected shifter into the pattern data generation system to generate phase shift pattern data having the data on the selected shifter;

(f) according to the data on the selected group of target hole and auxiliary holes on the target pattern data, the data on the selected hole unit cell on the layout data and the data on the selected shifter on the phase shift pattern data, generating mask exposure data on the selected group of target hole and auxiliary holes, mask exposure data on the selected hole unit cell and mask exposure data on the selected shifter, and entering these mask exposure data into an electron beam aligner;

(g) forming hole groups on a mask blank according to the mask exposure data on the selected group of target hole and auxiliary holes and the mask exposure data on the selected hole unit cell, and forming shifters on the mask blank according to the mask exposure data on the selected shifter; and (h) transferring desired hole patterns onto a resist film coated over the surface of the semiconductor substrate by using a phase shift mask having the hole groups and the shifters.

18. In the method of this invention for manufacturing a semiconductor integrated circuit device according to the above method 17, the auxiliary holes are polygons.

19. In the method of this invention for manufacturing a semiconductor integrated circuit device according to the above method 18, the auxiliary holes are placed in contact with the sides of the target hole.

20. The method of manufacturing a semiconductor integrated circuit device according to this invention has the following steps of:

(a) preparing a hole unit cell which comprises a rectangular target hole and auxiliary holes, the auxiliary holes being located close to the sides of the target hole in such a way that they will not be transferred onto the mask blank; and which is capable of being used commonly on individual layout data used for particular manufacturing processes that is entered into a pattern data generation system, and which is also capable of being repetitively placed at desired locations on the layout data;

(b) preparing several size-differing groups of target hole and auxiliary holes, several size-differing unit cells, each comprising a group of the target hole and auxiliary holes of corresponding size, and several size-differing shifters;

(c) selecting a desired group of target hole and auxiliary holes from the several size-differing groups of target hole and auxiliary holes, and entering data on the selected hole group into the pattern data generation system to generate target pattern data having the data on the selected hole group;

(d) selecting a desired hole unit cell from the several size-differing hole unit cells and entering data on the selected hole unit cell into the pattern data generation system to generate layout data having the data on the selected hole unit cell;

(e) selecting a desired shifter from the several size-differing shifters and entering data on the selected shifter into the pattern data generation system to generate phase shift pattern data having the data on the selected shifter;

(f) according to the data on the selected group of target hole and auxiliary holes on the target pattern data, the data on the selected hole unit cell on the layout data and the data on the selected shifter on the phase shift pattern data, generating mask exposure data on the selected group of target hole and auxiliary holes, mask exposure data on the selected hole unit cell and mask exposure data on the selected shifter, and entering these mask exposure data into an electron beam aligner;

(g) forming hole groups on a mask blank according to the mask exposure data on the selected group of target hole and auxiliary holes and the mask exposure data on the selected hole unit cell, and forming shifters on the mask blank according to the mask exposure data on the selected shifter; and (h) transferring desired hole patterns onto a resist film coated over the surface of the semiconductor substrate by using a phase shift mask having the hole groups and the shifters.

With the above-mentioned means, it is possible to reduce the design time for the phase shift mask and the data processing time by using hole unit cells, each comprising a target hole and auxiliary holes located close to the four sides of the target hole, and by generating the layout data and mask exposure data for the phase shift mask.

Further, by using a variety of arrangements and geometries of the target hole and the auxiliary holes located close to the sides of the target hole, it is possible to reduce the two-dimensional size of the hole unit cells and produce a phase shift mask with reduced intervals between the hole groups. This allows hole patterns to be formed on the resist film coated over the semiconductor wafer at narrower intervals.

BRIEF DESCRIPTION OF THE DRAWINGS

FIG. 1 is a plan view showing the essential portion of a conventional phase shift mask;

FIG. 2 is a plan view showing the essential portion of another conventional phase shift mask;

FIG. 3 is an essential-portion cross section taken along the line A—A of the phase shift mask of FIG. 1;

FIG. 4 is an essential-portion cross section taken along the line B—B of the phase shift mask of FIG. 2;

DESCRIPTION OF THE PREFERRED EMBODIMENTS

Figure 5:
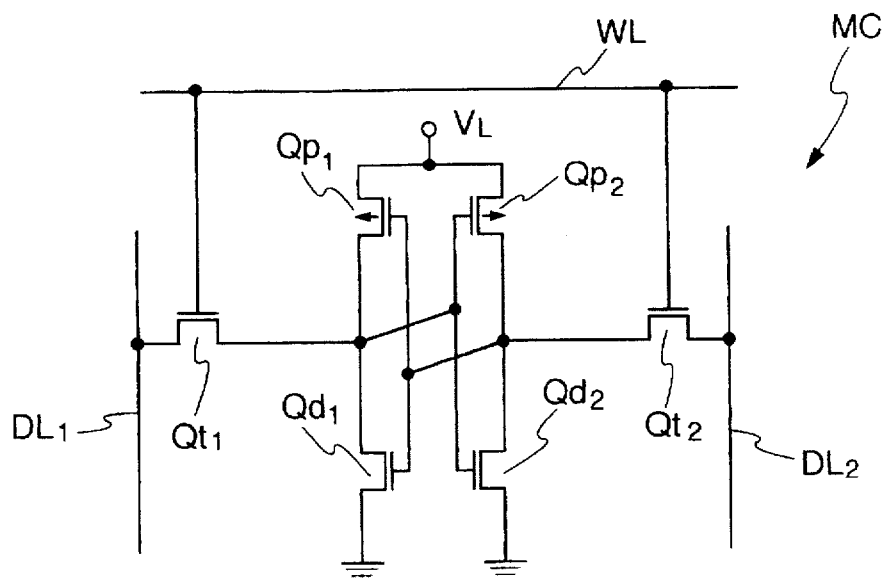
FIG. 5 is an equivalent circuit of an SRAM memory cell.

Embodiments of this invention are described in detail in the following.

Throughout the accompanying drawings, components that have the same functions are assigned like reference numerals and their explanations are not repeated.

The following embodiments are representative ones considered the most appropriate at present and it should be noted that constitutional elements making up each of the embodiments are not necessarily essential unless specifically so stated in many inventions contained in this specification. Geometrical expressions in the following descriptions should be taken as references more of general nature rather than as detailed definitive references to particular shapes. Hence, the word "square" include a rectangle, a lozenge, a parallelogram, a trapezoid, and a quadrilateral, which are close to the square, as well as squares in strictly mathematical terms. Similarly, attributes such as "same," "close," and "opposite" are meant to include those virtually having these attributes. As to the numbers of constitutional elements indicated in this specification, they may be smaller or greater, as required, unless specifically so stated.

A word "hole" refers to a hole pattern—such as a contact hole, a through hole and a via hole—which is close to the resolution limit of exposure. In the case of i-line (0.365 μm) of mercury lamp used in ultraviolet ray exposure, for example, the hole refers to a square pattern measuring 0.18–0.55 μm on each side, about 50–150% of the wavelength of exposure light. The shape of a target hole for a hole may be circular or polygon close to it. An auxiliary hole may be a square, triangle, circle, oval or polygon, or a combination of these, in addition to a commonly used rectangle close to a square.

A word "close or proximate" used in connection with the openings and patterns on the mask or semiconductor wafer, although it is self-evident in the phase shift technology, means that two objects under consideration are located so close to each other that, unless a mask or aligner is provided with a special measure, their presence will affect the transfer or projection characteristics of each other.

A word "target hole" means an opening in the light-shielding film on the mask which is of such a relatively large size as will allow the opening to be transferred onto the semiconductor wafer. A word "auxiliary hole" refers to an opening in the light-shielding film which is of such a relatively small size that it cannot be transferred by itself onto the semiconductor wafer.

Further, a word "phase shift mask" generally refers to a mask blank formed of one or two synthetic quartz glasses whose main surface is formed with openings provided with shifters and openings not provided with shifters, and which is used for reduction projection of a pattern onto the resist film over the semiconductor substrate by using a coherent or partly coherent single-color ultraviolet light.

(Embodiment 1)

The phase shift mask as the first embodiment of this invention, as well as its manufacturing technique and an exposure technique using this phase shift mask, is explained by referring to FIG. 8 to FIG. 23.

Figure 8:
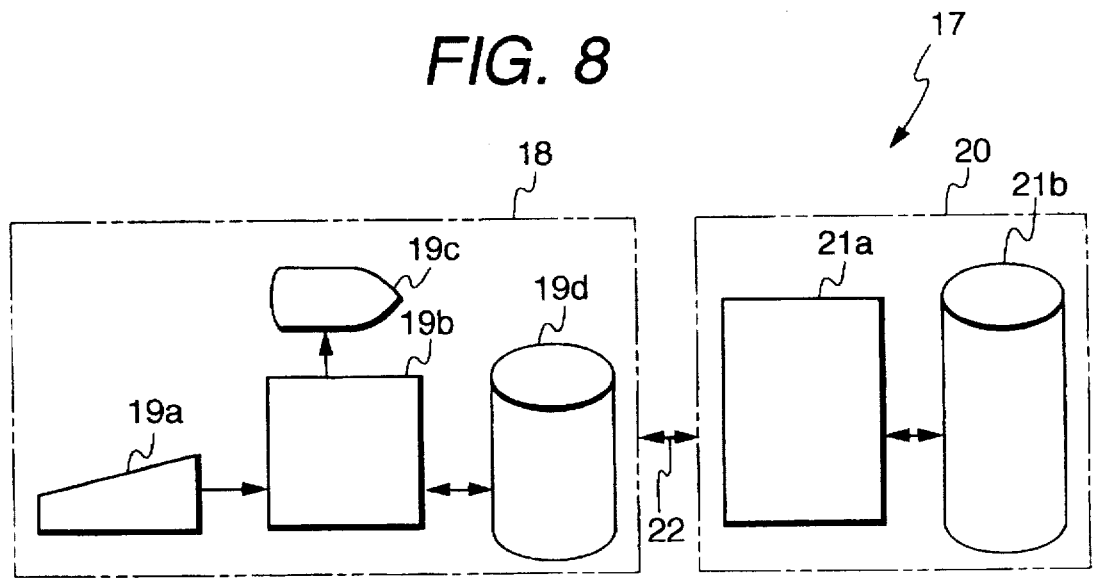
FIG. 8 is an explanatory diagram showing one form of pattern data generation system used in this invention to generate mask pattern data for the phase shift mask.

First, let us explain about a mask pattern data generation technique for the phase shift mask. FIG. 8 shows a pattern data generation system used to generate and verify the mask pattern data for the phase shift mask of the first embodiment of the invention.

A pattern data generation system 17 has a workstation system 18 and a large computer system 20, both electrically interconnected through a data communication cable 22.

The workstation system 18 includes an input device 19a, a workstation body 19b, a display 19c, and an external storage device 19d for workstation.

The input device 19a is a device to enter desired information into the workstation body 19b, such as a keyboard and mouse. The workstation body 19b performs specified data processing associated with generation and verification of mask pattern according to information entered from the input device 19a. The display 19c is an output device to display the mask pattern being generated and verified. The workstation body 19b is also electrically connected with other output devices such as printer and plotter in addition to the display 19c.

The large computer system 20 comprises a large computer body 21a and an external storage device 21b for the computer. The external storage device 21b stores mask pattern data currently being verified and correct mask pattern data that have passed verification.

Figure 9:
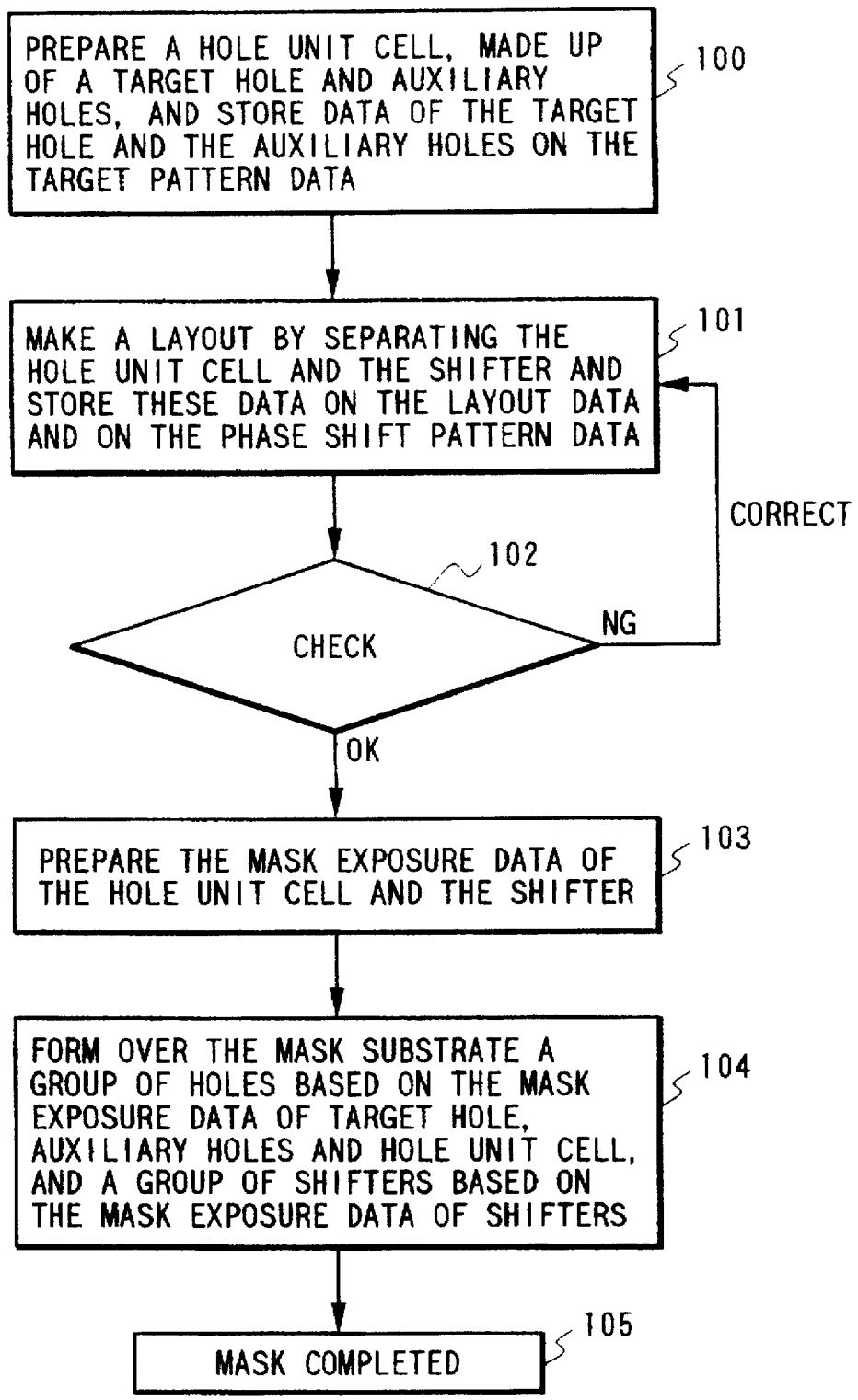
FIG. 9 is a flowchart showing one form of procedure of generating pattern data for the phase shift mask.
Figure 10:
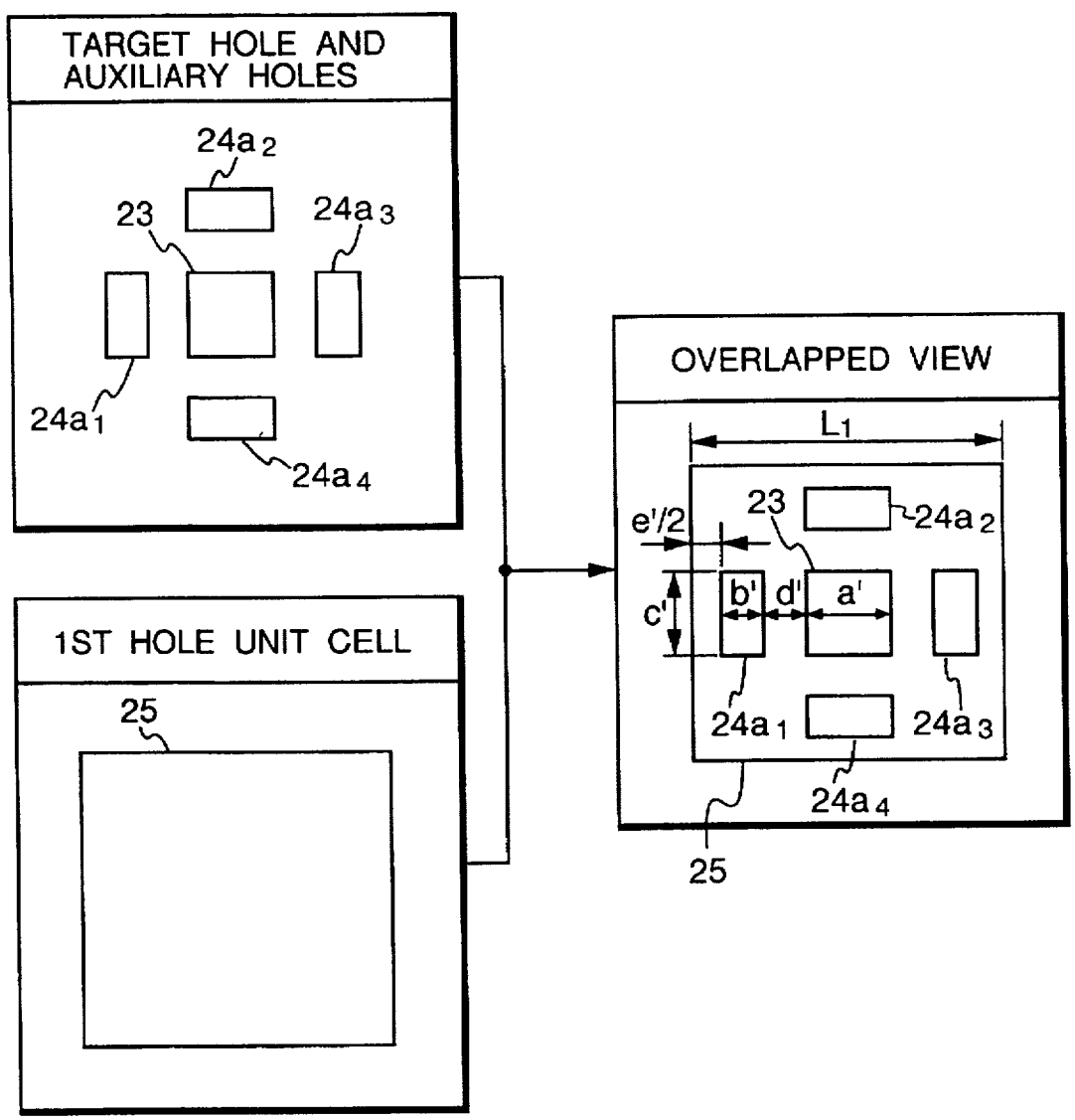
FIG. 10 is a schematic diagram showing one form of unit cell for hole that comprises a target hole and auxiliary holes.
Figure 11:
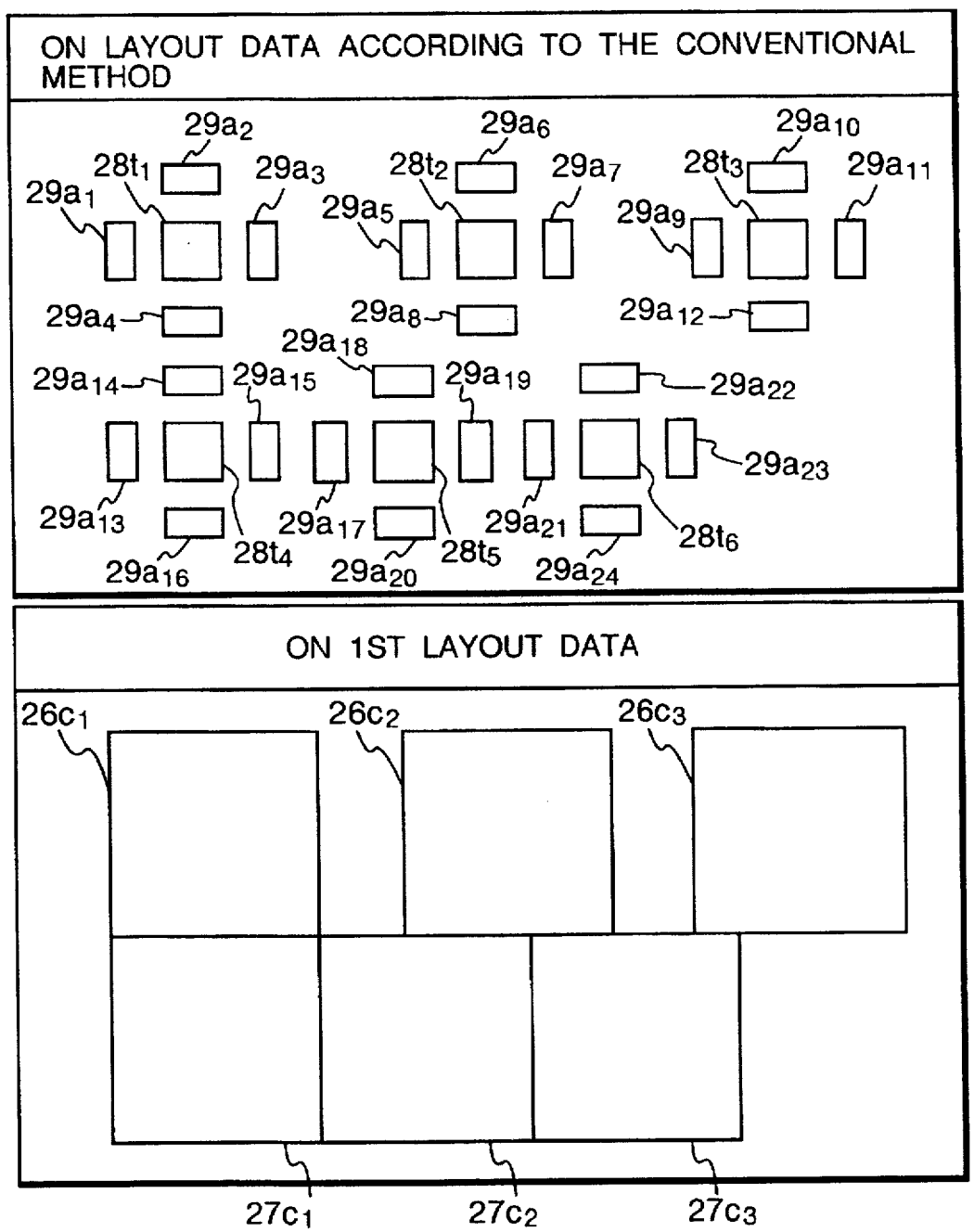
FIG. 11 is an explanatory view schematically showing hole unit cells stored on the layout data.

Next, by referring to FIG. 9 to FIG. 11, the mask pattern data generation technique using the pattern data generation system 17 and the method of arranging the mask patterns are described. FIG. 9 shows a flowchart explaining the process of generating pattern data for the phase shift mask of the first embodiment of this invention.

In the following description, we take as an example case a process of forming the phase shift mask SM of FIG. 1, which involves forming on this phase shift mask $SM_1$ one square target hole, four rectangular auxiliary holes arranged along the sides of the target hole, and a shifter arranged over the target hole.

First, a unit cell for a first hole, which has as one geometric pattern one target hole and four auxiliary holes, is prepared. Then, data on the arrangements and sizes of the one target hole and four auxiliary holes are stored on a target pattern data (step 100).

FIG. 10 shows one target hole 23, four auxiliary holes $24a_1$–$24a_4$, and one first hole unit cell 25, which comprises one target hole 23 and four auxiliary holes $24a_1$–$24a_4$. Also illustrated in the figure is a superimposed view of the target hole 23, the auxiliary holes $24a_1$–$24a_4$ and the first hole unit cell 25.

To prevent unwanted patterns from being transferred onto the resist film over the semiconductor substrate by adjacent auxiliary holes formed in the phase shift mask, the first hole unit cell includes a minimum distance e' between the adjacent auxiliary holes required to prevent unwanted pattern transfer.

Next, the first hole unit cells are laid out on a first layout data and the shifters are arranged on the phase shift pattern data to store the data of the first hole unit cells on the first layout data and store the shifter data on the phase shift pattern data (step 101).

The data of the first hole unit cells on the first layout data and the shifter data on the phase shift pattern data can be processed independently and also synthesized. Their synthesized patterns can be shown on the display.

As shown in FIG. 11, on the first layout data there are arranged first hole unit cells $26c_1$–$26c_3$ at a first pitch and first hole unit cells $27c_1$–$27c_3$ at a second pitch narrower than the first pitch, both unit cells arranged in the same orientation.

Because of the above arrangement of the first hole unit cells $26c_1$–$26c_3$, a first hole distribution area—which has hole groups, each consisting of the target hole and auxiliary holes, arranged at the first pitch—is laid out on the first layout data. Similarly, as the result of the above arrangement of the first hole unit cells $27c_1$–$27c_3$, a second hole distribution area—which has hole groups, each consisting of the target hole and auxiliary holes, arranged at the second pitch—is laid out on the first layout data.

In FIG. 11, the hole groups in the second hole distribution area are arranged most close to the adjacent hole groups in the first hole distribution area. FIG. 11 also shows the conventional layout data with the target holes $28t_1$–$28t_6$ and auxiliary holes $29a_1$–$29a_{24}$ arranged thereon.

Next, it is checked whether the data of the first hole unit cell on the first layout data and the shifter data on the phase shift pattern data meet the geometrical rules and electrical rules (step 102).

If these rules are not complied with, correction and check on the first hole unit cell data and shifter data are repeated until they comply with the rules.

When the generated mask pattern data is verified to be correct, mask exposure data for the first hole unit cells is prepared based on the first hole unit cell data, and shifter mask exposure data generated based on the shifter data (step 103). Then, the mask exposure data of the first hole unit cells is replaced with mask exposure data of the target hole and auxiliary holes to generate mask exposure data for the first hole distribution area and the second hole distribution area. Based on these mask exposure data, first hole groups and second hole groups are formed on the phase shift mask. Further, based on the shifter mask exposure data, shifter groups are formed on the phase shift mask (step 104). Now, the phase shift mask $SM_1$ is complete (step 105).

The mask exposure data refers to data for exposing a pattern that is used in an electron beam aligner when forming the target holes, auxiliary holes or shifters on the mask blank.

The first hole unit cells may be used commonly on individual layout data used for particular manufacturing steps.

Figure 12:
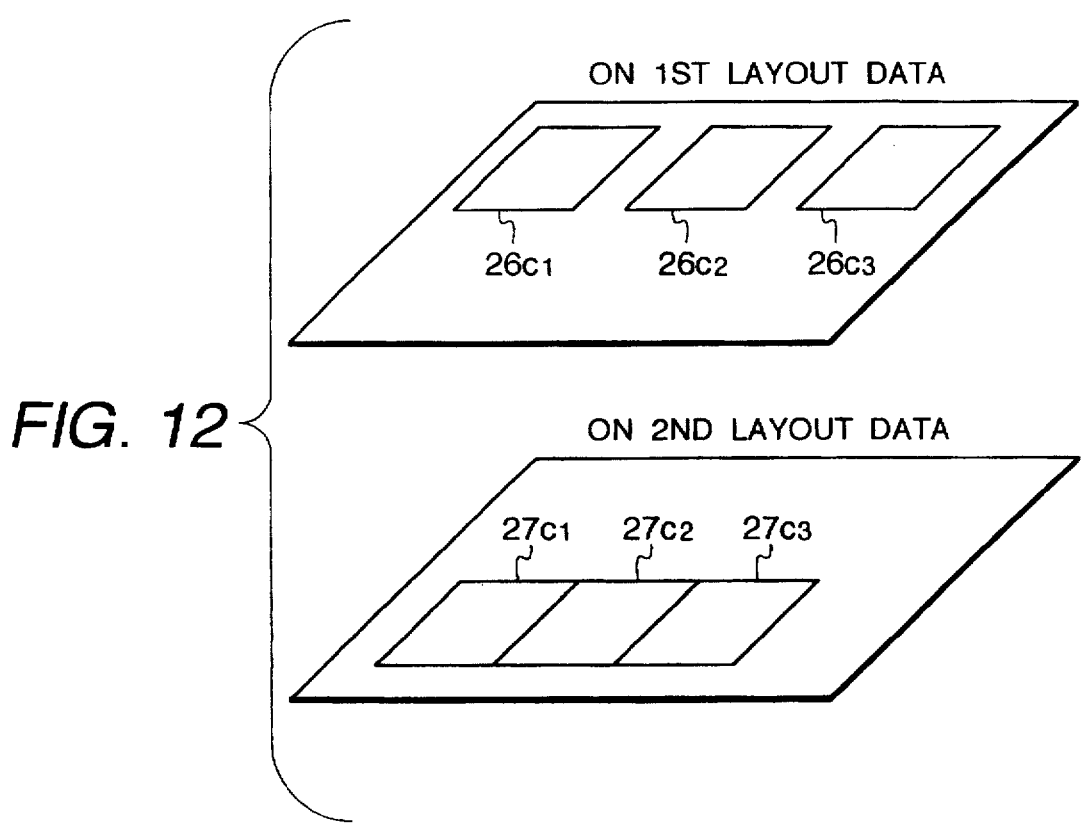
FIG. 12 is an explanatory view schematically showing hole unit cells stored on the layout data.

For example, as shown in FIG. 12, the first hole unit cells $26c_1$–$26c_3$ arranged at the first pitch in a certain orientation are laid out on the first layout data for the first phase shift mask, while the first hole unit cells $27c_1$–$27c_3$ arranged in the same orientation at the second pitch, narrower than the first pitch, are laid out on the second layout data.

That is, as a result of the arrangement of the first hole unit cells $26c_1$–$26c_3$, the first hole distribution area having hole groups—each comprising the target hole and auxiliary holes—arranged at the first pitch is laid out on the first layout data for the first phase shift mask. Likewise, because of the arrangement of the first hole unit cells $27c_1$–$27c_3$, the second hole distribution area having hole groups—each comprising the target hole and auxiliary holes—arranged at the second pitch is laid out on the second layout data.

After the pattern data have been checked, the mask exposure data of the first hole unit cells are generated based on the first hole unit cell data. Then, the mask exposure data of the first hole unit cells is replaced with the mask exposure data of the target hole and auxiliary holes to generate mask exposure data of the first hole distribution area made up of hole groups. Based on this mask exposure data, first hole groups are formed on the first phase shift mask. In the similar manner, mask exposure data of the second hole distribution area made up of hole groups is generated. Based on this mask exposure data, second hole groups are formed on the second phase shift mask.

It is also possible to prepare several kinds of hole unit cells, each comprising a target hole and auxiliary holes, which have different arrangements and sizes, and then to arrange these different kinds of hole unit cells commonly on individual data used for particular manufacturing process steps.

Figure 13:
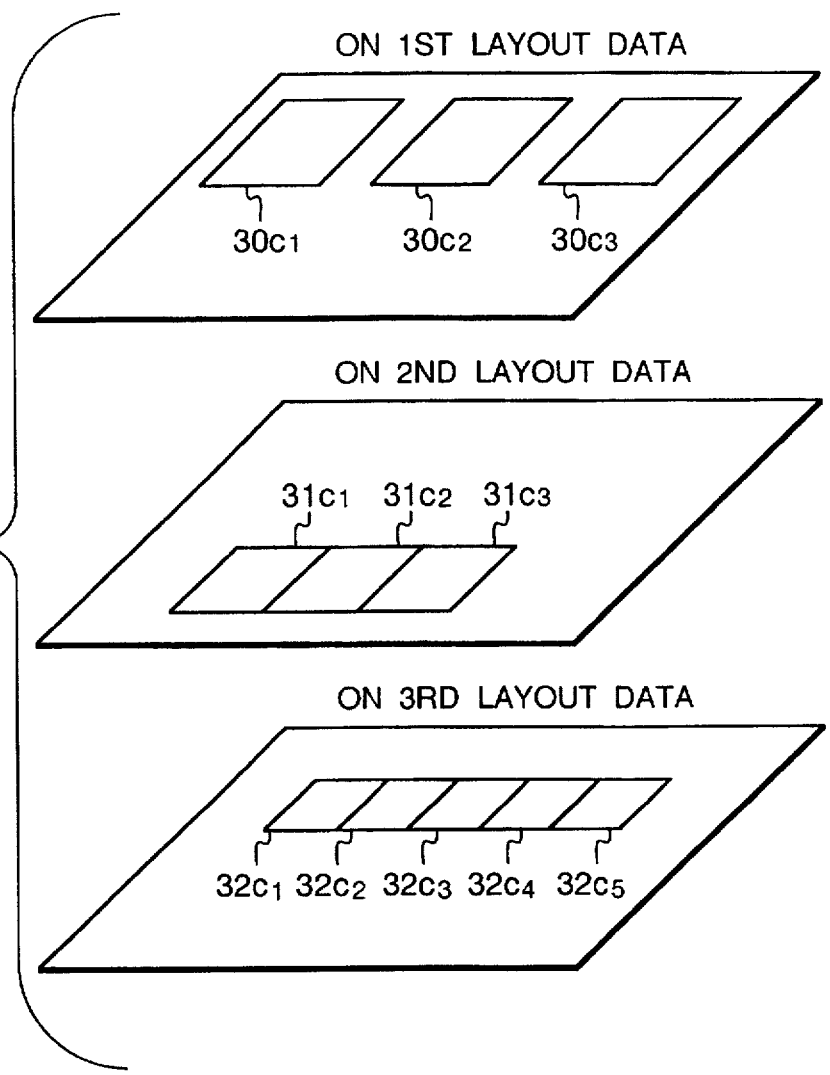
FIG. 13 is an explanatory view schematically showing hole unit cells stored on the layout data.

For example, as shown in FIG. 13, first hole unit cells $30c_1$–$30c_3$ arranged in a certain orientation at a first pitch are laid out on the first layout data for the first phase shift mask; second hole unit cells $31c_1$–$31c_3$, smaller in size than the first hole unit cells $30c_1$–$30c_3$ and arranged in the same orientation, are laid out on the second layout data for the second phase shift mask; and third hole unit cells $32c_1$–$32c_5$, smaller in size than the second hole unit cells $31c_1$–$31c_3$ and arranged in the same orientation, are laid out on the third layout data for the third phase shift mask.

That is, because of the arrangement of the first hole unit cells $30c_1$–$30c_3$, the first hole distribution area having hole groups—each comprising the target hole and auxiliary holes—arranged at the first pitch is laid out on the first layout data for the first phase shift mask; as a result of the arrangement of the second hole unit cells $31c_1$–$31c_3$, the second hole distribution area having hole groups—each comprising the target hole and auxiliary holes—arranged at the second pitch is laid out on the second layout data for the second phase shift mask; and as a result of the arrangement of the third hole unit cells $32c_1$–$32c_5$, the third hole distribution area having hole groups—each comprising the target hole and auxiliary holes—arranged at the third pitch is laid out on the third layout data for the third phase shift mask.

After the pattern data have been checked, the mask exposure data of the first, second and third hole unit cells are generated based on the first, second and third hole unit cell data. Then, the mask exposure data of the first hole unit cells is replaced with the mask exposure data of the target hole and auxiliary holes to generate mask exposure data of the first hole distribution area made up of hole groups. Based on this mask exposure data, first hole groups are formed on the first phase shift mask. Similarly, based on the mask exposure data of the second hole distribution area made up of hole groups, second hole groups are formed on the second phase shift mask. Further, based on the mask exposure data of the third hole distribution area made up of hole groups, third hole groups are formed on the third phase shift mask.

Figure 14:
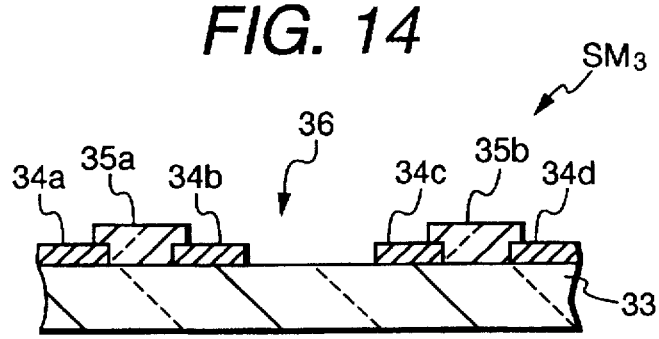
FIG. 14 is a cross section showing an essential portion of the phase shift mask.

Next, let us explain about the phase shift mask, as the first embodiment of this invention, which is generated by using the mask pattern data. FIG. 14 shows an essential part of the cross section of a phase shift mask $SM_3$. In the figure, designated 33 is a mask blank made of a synthesized quartz glass, 34a–34d light-shielding films made of chromium (Cr), 35a and 35b shifters, and 36 an exposed portion of the mask blank or non-shifted light transmitting portion. The mask blank exposed portion does not necessarily mean that the quartz glass substrate itself is exposed. It may comprise a quartz glass substrate that constitutes the mask blank body, and a thin transparent film deposited over its surface.

The shifters 35a, 35b define the thickness of a transparent material (thickness of the central part of the shifter opening) determined by the refractivity of the transparent material and the wavelength of the transmitting light. They are transparent thin films made of SOG (Spin On Glass), indium oxide (InOx), etc.

Figure 15:
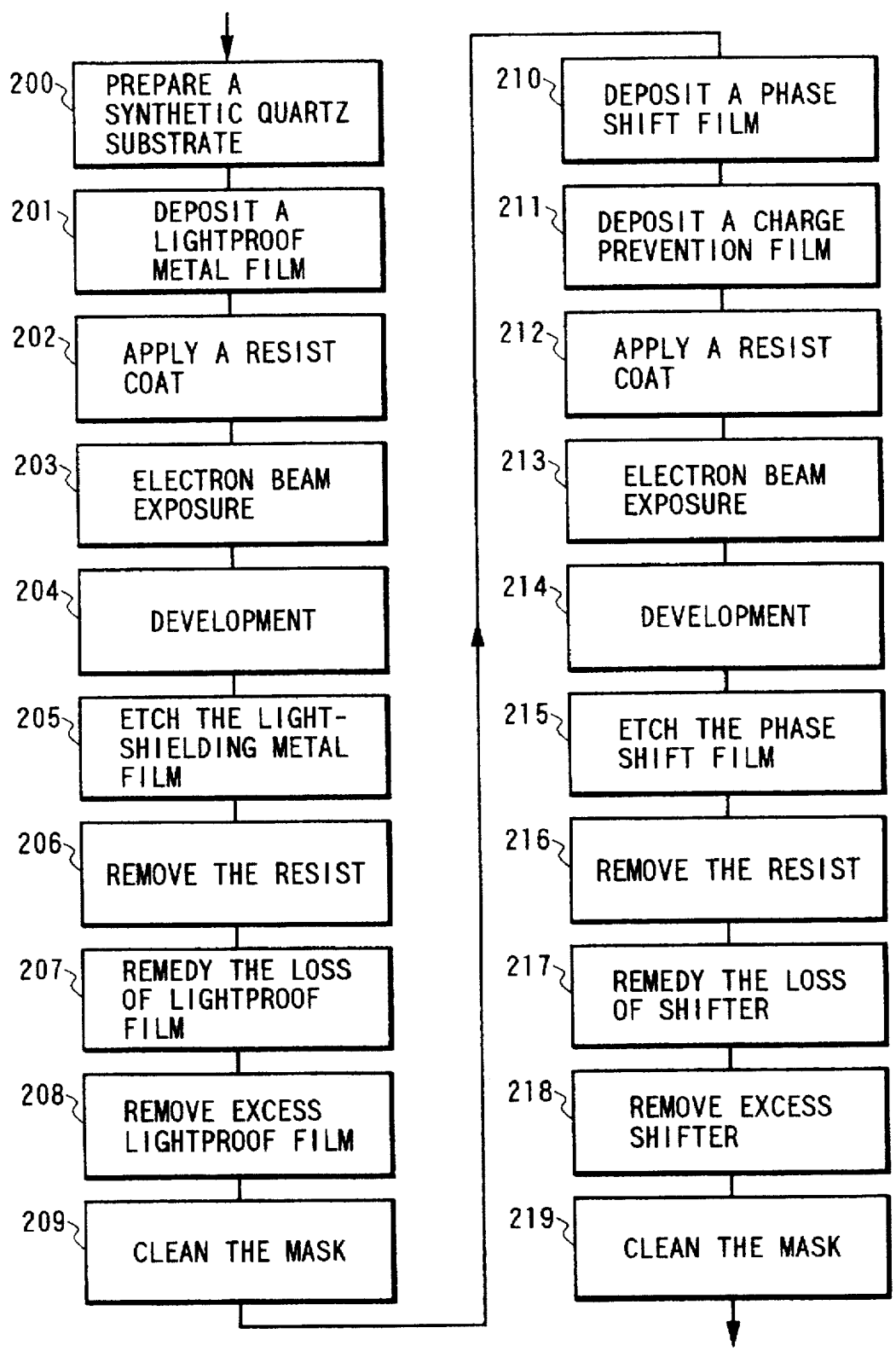
FIG. 15 is a flowchart showing a procedure of making the phase shift mask of FIG. 14.

Next, the method of producing the phase shift mask $SM_3$ is described in accordance with the process steps 200–219 shown in FIG. 15.

First, the surface of the synthesized quartz glass is polished and washed with water to make the mask blank 33 (step 200). Over the entire main surface of the mask blank, chromium (Cr) is sputtered to deposit a metal light-shielding film about 0.05–0.3 µm thick (step 201).

Then, an electron-sensitive resist film is spin-coated to a thickness of about 0.1–0.8 µm over the entire surface of the metal light-shielding film (step 202). After this, the resist film is exposed by an electron beam aligner according to the direct exposure method to transfer a desired pattern of hole groups onto the electron-sensitive resist film over the metal light-shielding film (step 203).

This electron beam direct exposure processing involves irradiating an electron beam against the specified locations on the mask blank 33 according to the mask exposure data to transfer the pattern of hole groups of the specified geometry onto the electron-sensitive resist film. The mask exposure data used here was generated based on that part of the correct mask pattern data which concerns the target hole, auxiliary holes and hole unit cells. The correct mask pattern data was generated according to the above-mentioned mask pattern data generation method, verified by the pattern data generation system 17 and then stored in the external storage device 21b.

Then, when the electron-sensitive resist film is of positive type, the exposed parts are removed by a specified developing liquid (step 204) and, with the remaining electron-sensitive resist film as an etching mask, the metal light-shielding film is etched by wet etching to form a specified pattern of hole groups on the mask blank 33 (step 205).

When the electron-sensitive resist film is of negative type, the non-exposed portions are removed with a specified development liquid (step 204) and, with the remaining electron-sensitive resist film as an etching mask, the metal light-shielding film is etched by wet etching to form a specified pattern of hole groups on the mask blank 33.

Then, subsequent steps, including the removing of the resist film 206, the correction of defective metal light-shielding film 207, the removing of excess light-shielding film 208 and the mask cleaning 209, are performed. This is followed by depositing, on the mask blank 33 through spin coating, a phase shift film of, say, SOG that shifts the phase of the transmitting light (step 210).

The SOG, after being applied over the mask blank 33, is baked at elevated temperatures. To invert the phase of the transmitting light, the thickness of the phase shift film d must meet the following requirement:

$$d=\lambda/2(n-1)$$

where $\lambda$ is the wavelength of transmitting light and n is refractivity of the transparent film.

If, for example, we let the wavelength of light used for exposure be $\lambda=0.365$ µm (i-line) and the refractive index of the phase shift film be $n=1.5$, then the thickness of the phase shift film needs to be about 0.37 µm.

Next, a charge prevention film made of aluminum (Al) is deposited over the phase shift film to a thickness of 0.05 µm by sputtering (step 211). The charge prevention film is then coated with an electron-sensitive resist film for patterning the phase shift film (step 212).

Then, the resist film is exposed by the electron beam aligner according to the direct exposure method to transfer a desired shifter pattern onto the electron-sensitive resist film (step 213).

This electron beam direct exposure processing involves irradiating an electron beam against the specified locations on the mask blank 33 according to the mask exposure data to transfer the specified shifter pattern onto the electron-sensitive resist film. The mask exposure data used here was generated based on the shifter data of the correct mask pattern data, the correct mask pattern data being verified by the pattern data generation system 17 and then stored in the external storage device 21b.

The process is followed by the development step 214, the etching step 215 to etch the phase shift film with the resist film formed by the development step used as an etch mask, the resist film removing step 216, the defective shifter correction step 217, the excess shifter removing step 218, and the mask cleaning step 219. With these steps completed, the phase shift mask $SM_3$ is produced.

Figure 16:
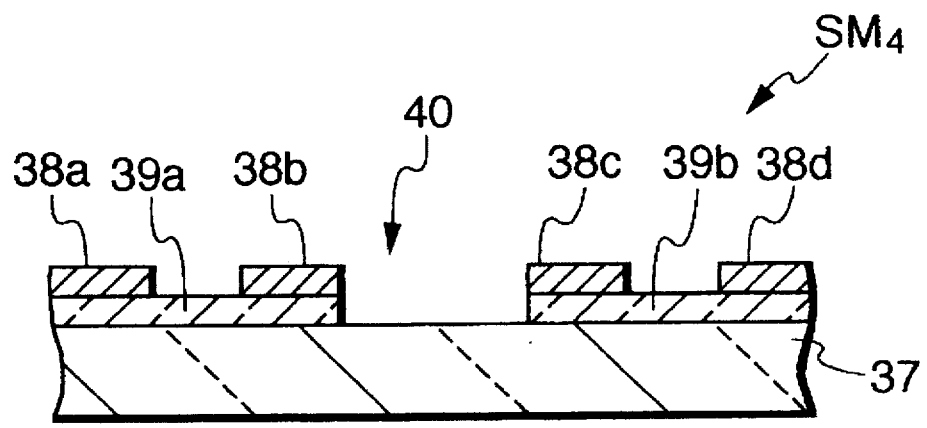
FIG. 16 is a cross section showing an essential portion of another phase shift mask.

In the phase shift mask $SM_3$ shown in FIG. 14, the light-shielding films 34a–34d are deposited over the mask blank 33 and the shifters 35a, 35b are formed over the light-shielding films 34a–34d so that the light-shielding film are sandwiched between them. The phase shift mask, however, may have the construction $SM_4$, as shown in FIG. 16, in which the shifters 39a, 39b are formed over the mask blank 37, on which light-shielding film 38a–38d are formed so that the shifters are sandwiched between them. In the figure, reference number 40 represents an exposed part of the mask blank.

Figure 17:
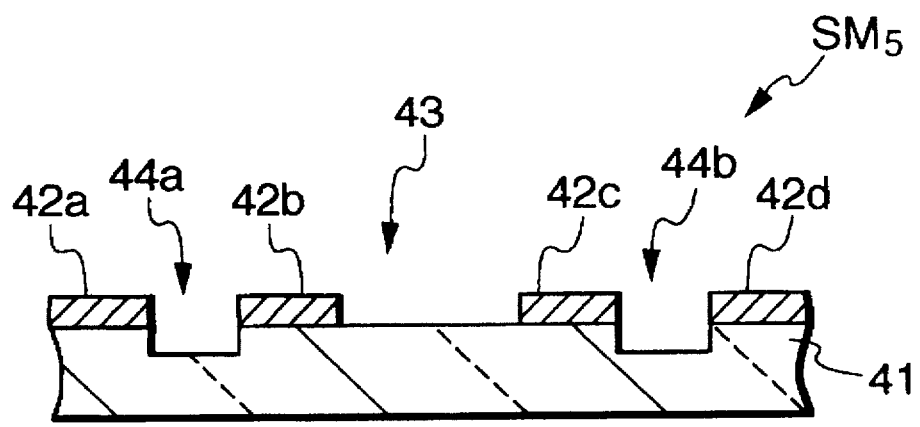
FIG. 17 is a cross section showing an essential portion of still another phase shift mask.

Further, as shown in FIG. 17, it is possible to use a phase shift mask $SM_5$ in which the mask blank 41 is encroached by etching. In the figure, reference numerals 42a–42d denote light-shielding films, 43 a mask blank exposed portion, and 44a and 44b etched portions in the mask blank.

Figure 18:
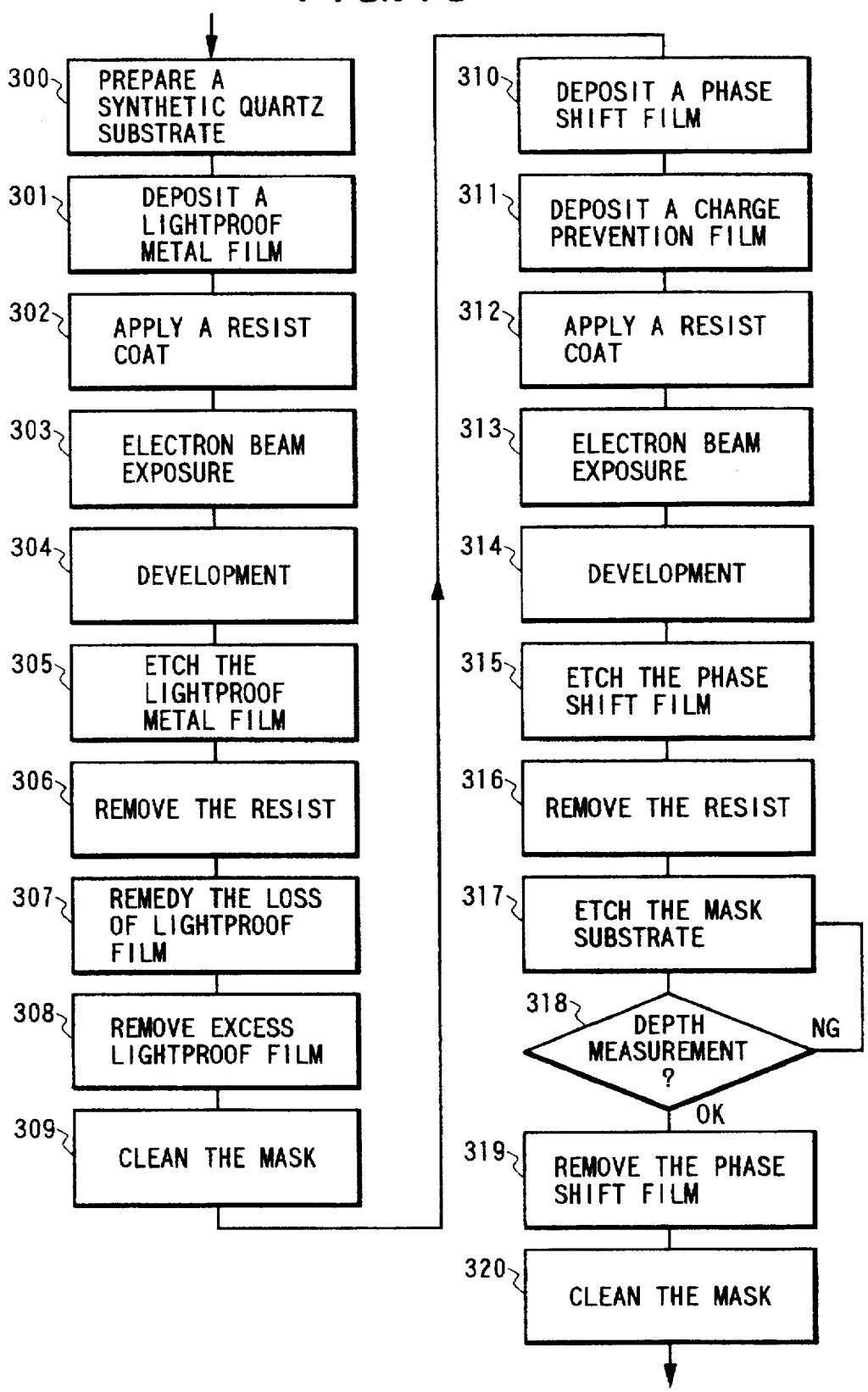
FIG. 18 is a flowchart showing a procedure of making the phase shift mask of FIG. 17.

Next, the process of making the phase shift mask $SM_5$ of a moat-in-mask-blank type by referring to the process steps 300–320 in FIG. 18.

According to the steps 200–213 of FIG. 15, the mask blank 41 is formed with hole groups and an electron beam is irradiated against the specified locations on the mask blank to transfer a specified shifter pattern onto the electron-sensitive resist film (steps 300–313).

Then, with the resist film pattern formed by the development processing (step 314) used as an etching mask, the phase shift film is etched (step 315) to form a specified pattern of phase shift film on the mask blank 41.

After removing the resist film (step 316), the mask blank 41 is etched with the pattern of the phase shift film as an etching mask (step 317).

Here, the etching depth into the mask blank 41 is so set that a phase difference is produced between the light that has passed through the mask blank exposed portion 43 and the light that has passed through the etched regions (mask blank etched portions) 44a, 44b of the mask blank 41 (step 318).

Then, after the phase shift film removing step 319 and the mask cleaning step 320 are performed, the phase shift mask $SM_5$ of the moat-in-mask-blank type is obtained.

Next, the exposure technique using the phase shift mask formed by the above method is explained.

Figure 19:
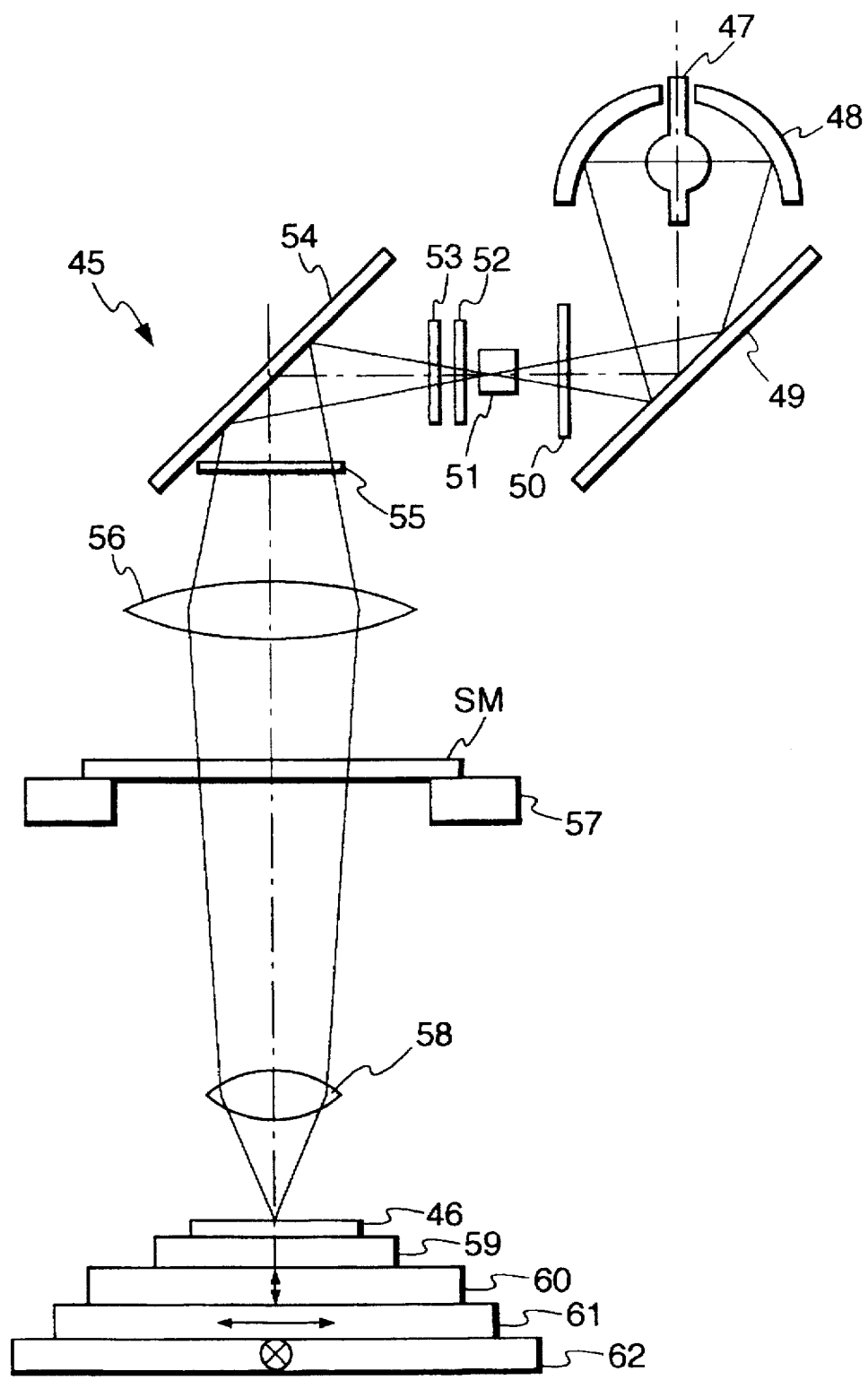
FIG. 19 is an explanatory view showing a reduction projection aligner using the phase shift mask.

FIG. 19 shows a reduction projection aligner 45 that is used in exposing the first embodiment of this invention. An example of the lens type i-line 5:1 reduction projection aligner of step-and-repeat mode that is applicable to this exposure is a Nikon's i-line stepper NRS-1755i7A (NA=0.5, exposure area=17.5 mm square). In the figure, reference number 46 represents a semiconductor wafer of monocrystalline silicon 5–8 inch across; 47 a high-pressure mercury lamp as a light source; 48 a focusing mirror; 49 a first plane reflector; 50 a shutter; 51 fly eye lens; 52 an aperture to adjust the coherence factor σ (in this embodiment 1, σ=0.5); and 53 a short-cut filter to cut off far-ultraviolet radiation with a shorter wavelength than the i-line when the i-line (365 nm) is used. Denoted 54 is a second plane reflector, 55 a mask blind to define the range of transfer area, 56 a condenser lens to produce Koehler illumination, and 57 a mask holder holding the phase shift mask SM and finely adjustable in the Z-direction. Designated 58 is a reduction projection lens generally made up of a number of lenses which, in the above reduction projection aligner 45, is formed telecentric on the semiconductor wafer 46 side. The phase shift mask SM side may also be formed telecentric. Denoted 59 is a wafer suction mount that holds the semiconductor wafer 46 by suction, 60 a Z-axis table (height direction), 61 an X-axis table (horizontal lateral direction), and 62 a Y-axis table (horizontal longitudinal direction), which, together with the X-axis table 61, forms an XY stage.

In the exposure processing, the beam emitted from the high-pressure mercury lamp 47 is irradiated against the surface of the semiconductor wafer 46 through the first plane reflector 49, shutter 50, fly eye lens 51, aperture 52, short-cut filter 53, second plane reflector 54, mask blind 55, condenser lens 56, phase shift mask SM and reduction projection lens 58.

Next, with reference to FIGS. 20–23, we offer brief explanation about a photoetching process, which involves transferring by using the phase shift mask fine hole patterns onto the resist film coated over the semiconductor substrate and then forming the hole patterns on the insulating film underlying the resist film.

The photoetching process is divided into a photolithography process for forming a resist film pattern on the semiconductor wafer, an etching process for etching the insulation film with the resist film pattern used as a mask, and a resist film removing process for removing the resist film pattern.

Figure 20:
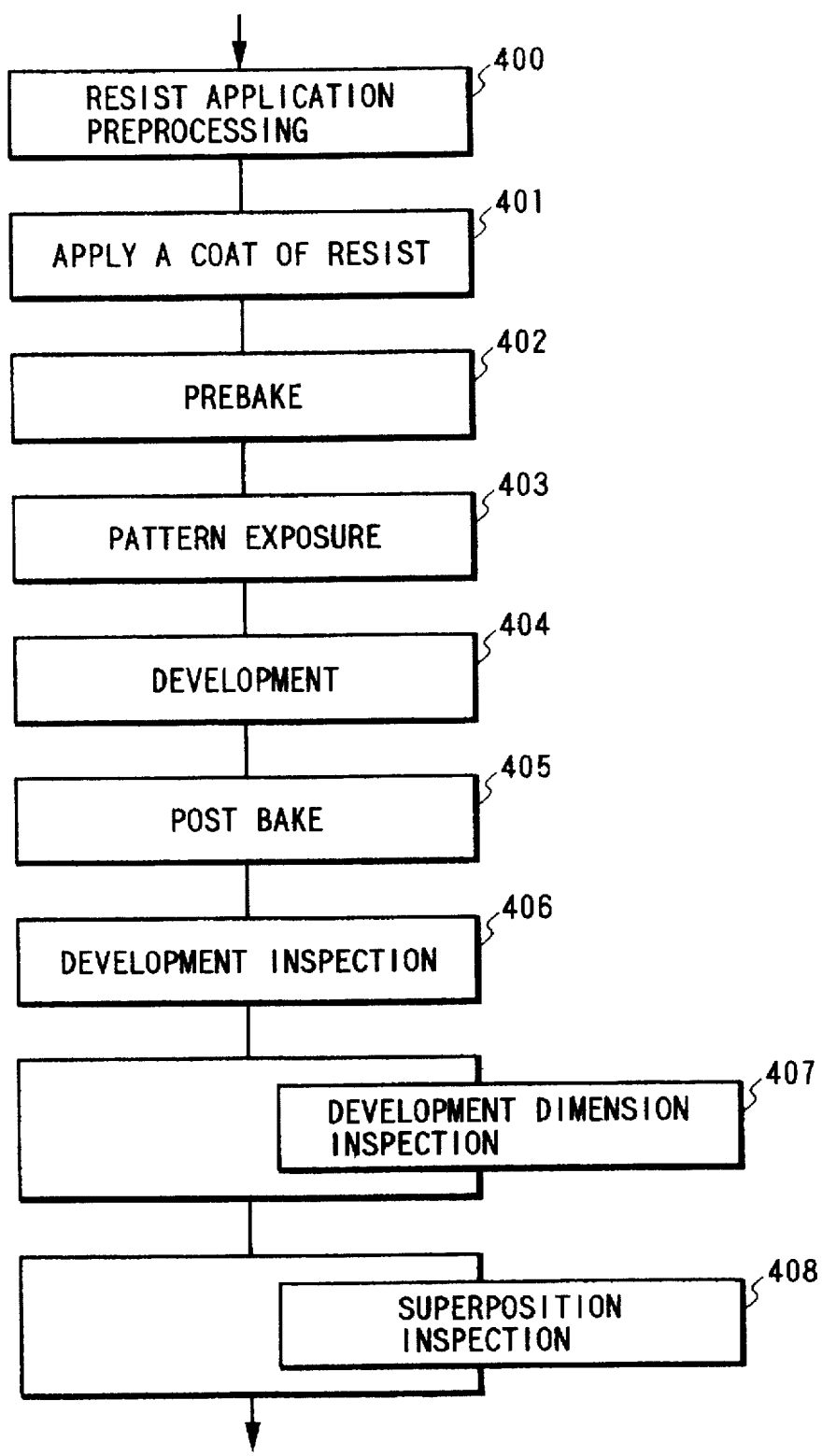
FIG. 20 is a flowchart showing a photolithography process using the phase shift mask.
Figure 21:
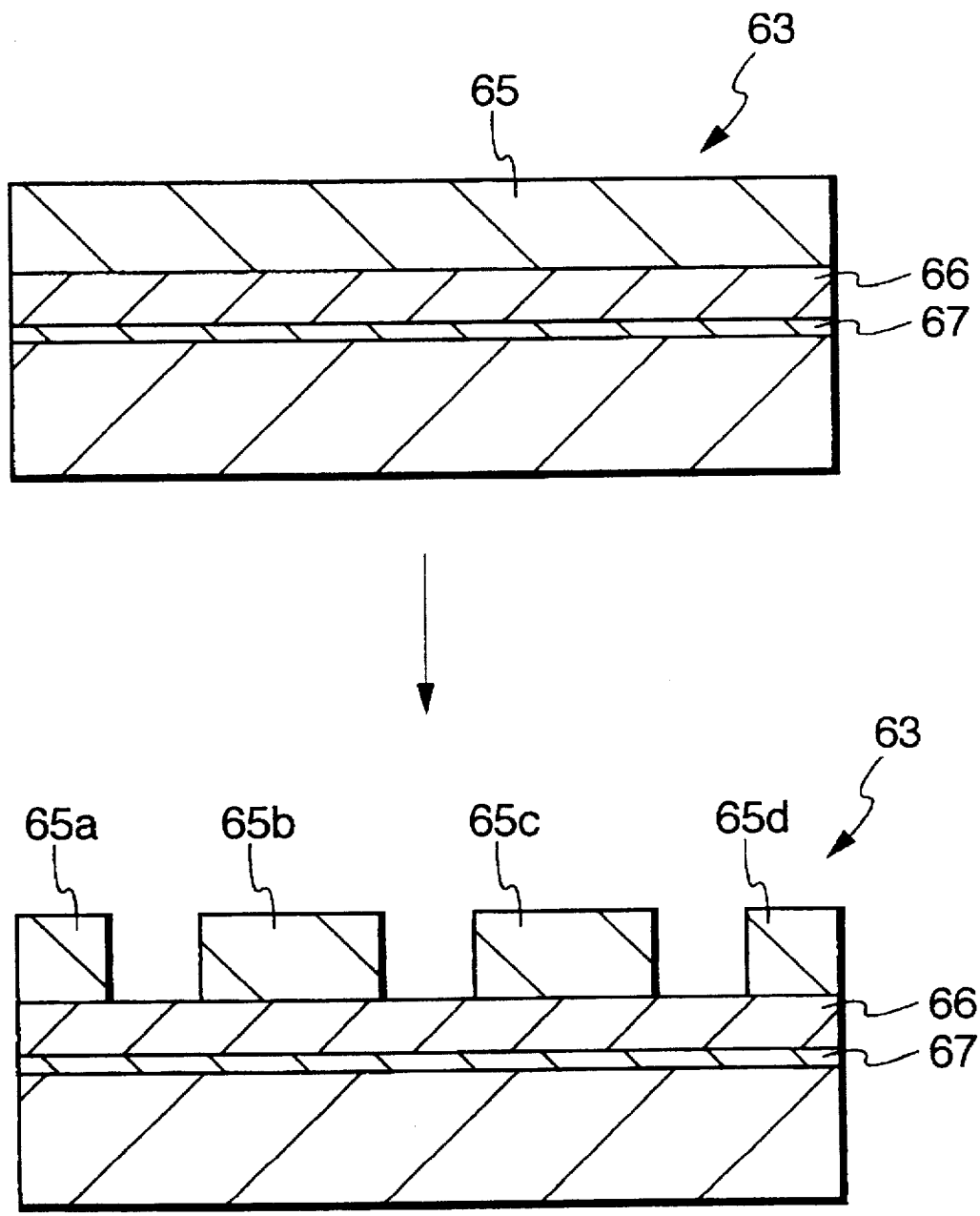
FIG. 21 is an essential-part cross section of a semiconductor wafer used to explain the photolithography process using the phase shift mask.

The photolithography process is now described by referring to steps 400–408 in FIG. 20 and to the essential-part cross section of the semiconductor wafer shown in FIG. 21.

First, the surface or back of the semiconductor wafer 63 is cleared of foreign matters, and then a resist application preprocessing is performed to promote the adhesion of the resist film to the semiconductor wafer 63 (step 400).

Next, as shown in FIG. 21, the semiconductor wafer 63, after being preprocessed, is spin-coated with a resist film 65 1–2 μm thick (step 401). This method involves placing the semiconductor wafer 63 on the spin chuck, dripping 1–5 ml of resist onto the wafer, and spinning the semiconductor wafer 63 at 2000–5000 rpm to spread by centrifugal force the resist film 65 over the surface of the semiconductor wafer 63.

The photoresist materials used in semiconductor device manufacturing are a negative ultraviolet ray resist and a positive ultraviolet ray resist. The positive ultraviolet ray resist is mainly used for its high resolution.

Then, a hot plate is used to bake the semiconductor wafer 63 to vaporize a residual solvent, which is present in large amount in the resist film 65 immediately after the spin coating, in order to stabilize the photochemical reaction during exposure (step 402).

Next, the semiconductor wafer 63 is set, along with the specified phase shift mask, in the reduction projection aligner 45 and, after being precisely positioned, is irradiated with wavelength 0.365 μm of an ultraviolet beam (i-line) for a predetermined period of time to burn in the mask pattern (step 403).

Then, a development liquid is dripped on the surface of the semiconductor wafer 63 and is allowed to remain thick on the surface by surface tension. After the development processing has been performed for a specified duration, the wafer is rinsed with pure water, immediately followed by rotation drying (step 404). As a result, as shown in FIG. 21, the areas of the resist film 65 where a sharp change in light intensity was produced during the exposure and which correspond to the positions of target holes in the phase shift mask are removed, forming the hole patterns in the resist film 65.

After this, the semiconductor wafer 63 is baked at around 120° C. to be completely dried to improve the adhesion of the resist film 65 to the semiconductor wafer 63 as well as the dry etching resistance by thermal cross-linking polymerization (step 405).

The appearance of the semiconductor wafer 63 is inspected by a metal microscope (step 406). Measurement of dimensions of the hole patterns formed on the resist film and their positioning are performed as required (step 407, 408).

Figure 22:
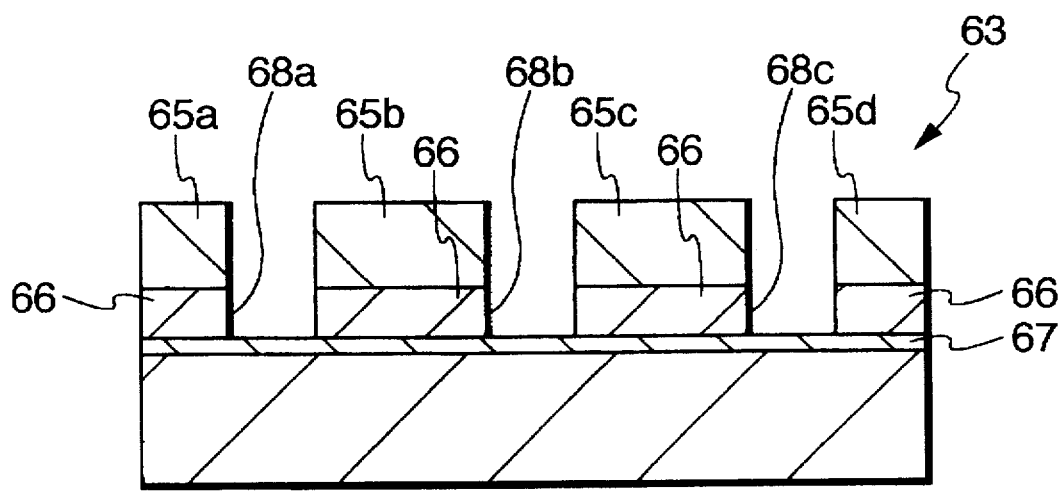
FIG. 22 is an essential-part cross section of a semiconductor wafer used to explain a dry etching process using the phase shift mask.
Figure 23:
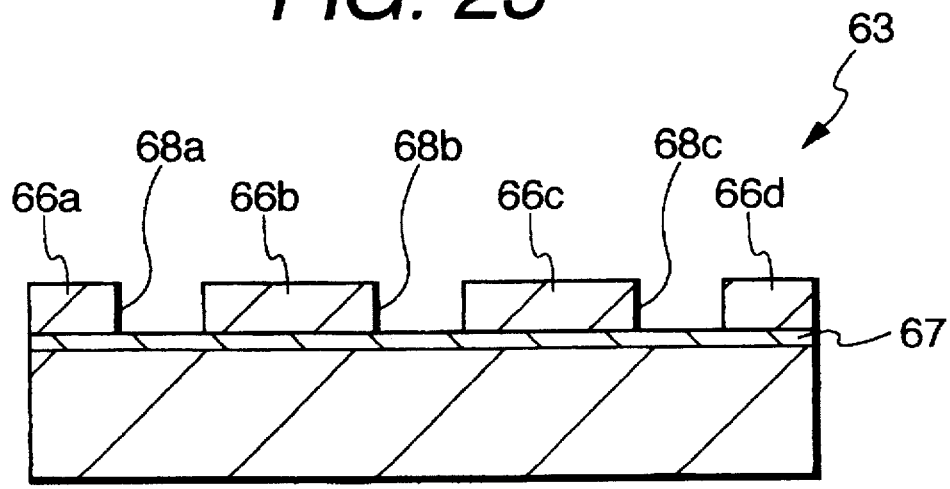
FIG. 23 is an essential-part cross section of a semiconductor wafer used to explain a resist removing process using the phase shift mask.

Next, the etching process and the resist film removing process are explained by referring to the essential-part cross section of the semiconductor wafer shown in FIGS. 22 and 23.

First, the surface of the semiconductor wafer 63 is treated to ensure good performance of etching. A representative surface treatment is an $O_2$ plasma treatment that removes scum that is produced during the development of the resist film.

Then, as shown in FIG. 22, with the patterned resist films 65a–65d as a mask, the insulating film 66 on the semiconductor wafer 63 is removed by dry etching to form hole patterns 68a–68c in the insulating film 66.

When the insulating film 66 is made of a silicon oxide film ($SiO_2$), the silicon oxide film is etched by a microwave plasma etching using a gas mixture of $CF_4$ and $H_2$ or a $CHF_3$ gas.

Next, to remove a damaged layer of the surface of the underlying film 67, the underlying film surface is lightly etched—a low damage ashing processing.

Then, the appearance of the semiconductor wafer 63 is inspected and measurement is taken, as necessary, of the thickness of the insulating film 66 etched with a special pattern to check if the amount of etch is correct.

Next, as shown in FIG. 23, the resist film 65a–65d now unnecessary are removed from the semiconductor wafer 63 by ashing that uses a plasma oxide. Then, metal ions and fine debris on the surface of the semiconductor wafer 63 that failed to be removed by ashing and adhered there during the etching process are washed away. Among possible cleansing methods are $NH_4OH/H_2O_2$ cleansing, $HCl/H_2O_2$ cleansing or $NH_4OH/CH_3COOH$ cleansing.

Finally, to ensure early detection of bad appearance and to prevent contaminated semiconductor wafer 63 from being fed to the next process, the appearance of the semiconductor wafer 63 is inspected by the metal microscope. Now, the photoetching process for the semiconductor wafer 63 is complete.

As mentioned above, with the first embodiment of this invention, one target hole and auxiliary holes formed close to the four sides of the target hole make up each of the hole unit cells, which are laid out on the layout data to generate data on the hole groups in the phase shift mask that is used in forming hole patterns in the resist film over the semiconductor substrate. Hence, there is no need to design and arrange the target holes and the auxiliary holes individually on the layout data. Further, this technique reduces the number of data entered into the pattern data generation system and the number of mask exposure data entered into the electron beam aligner, and also shortens the data processing time. This in turn minimizes an increase in the time for designing and manufacturing the phase shift mask.

(Embodiment 2)

Figure 24:
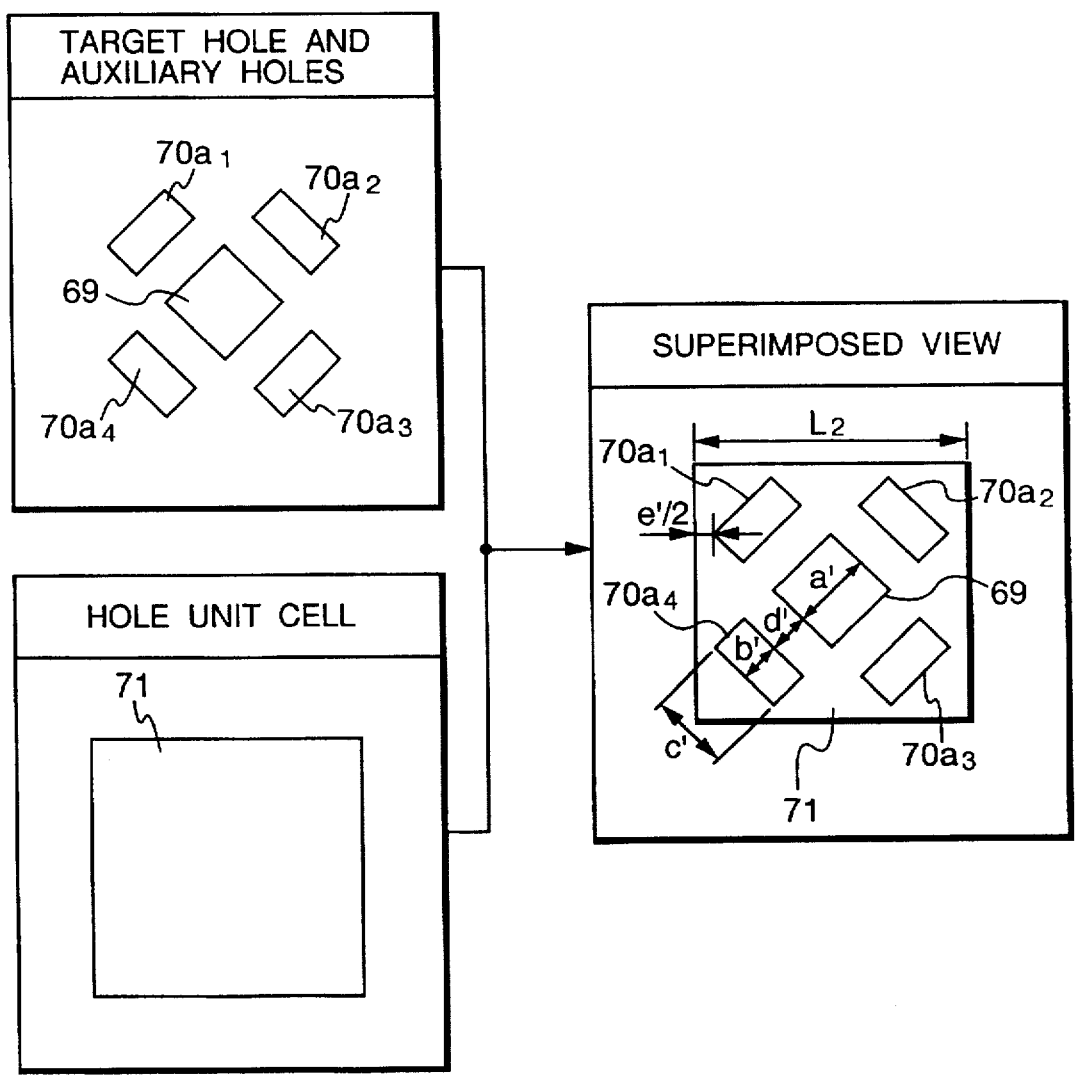
FIG. 24 is an explanatory view schematically showing another form of unit cell for hole that comprises a target hole and auxiliary holes.
Figure 25:
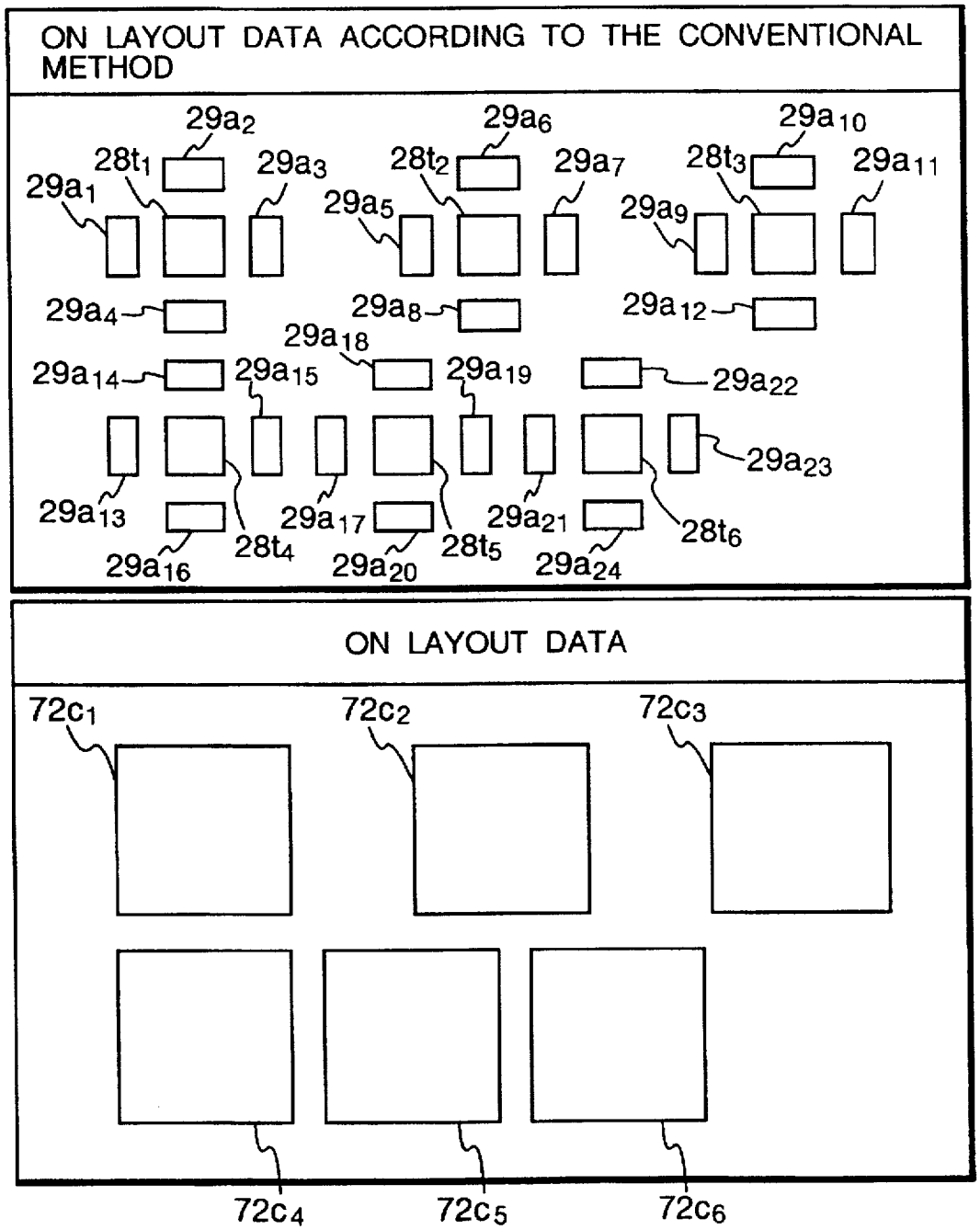
FIG. 25 is an explanatory view schematically showing a unit cell for hole stored on the layout data.
Figure 26:
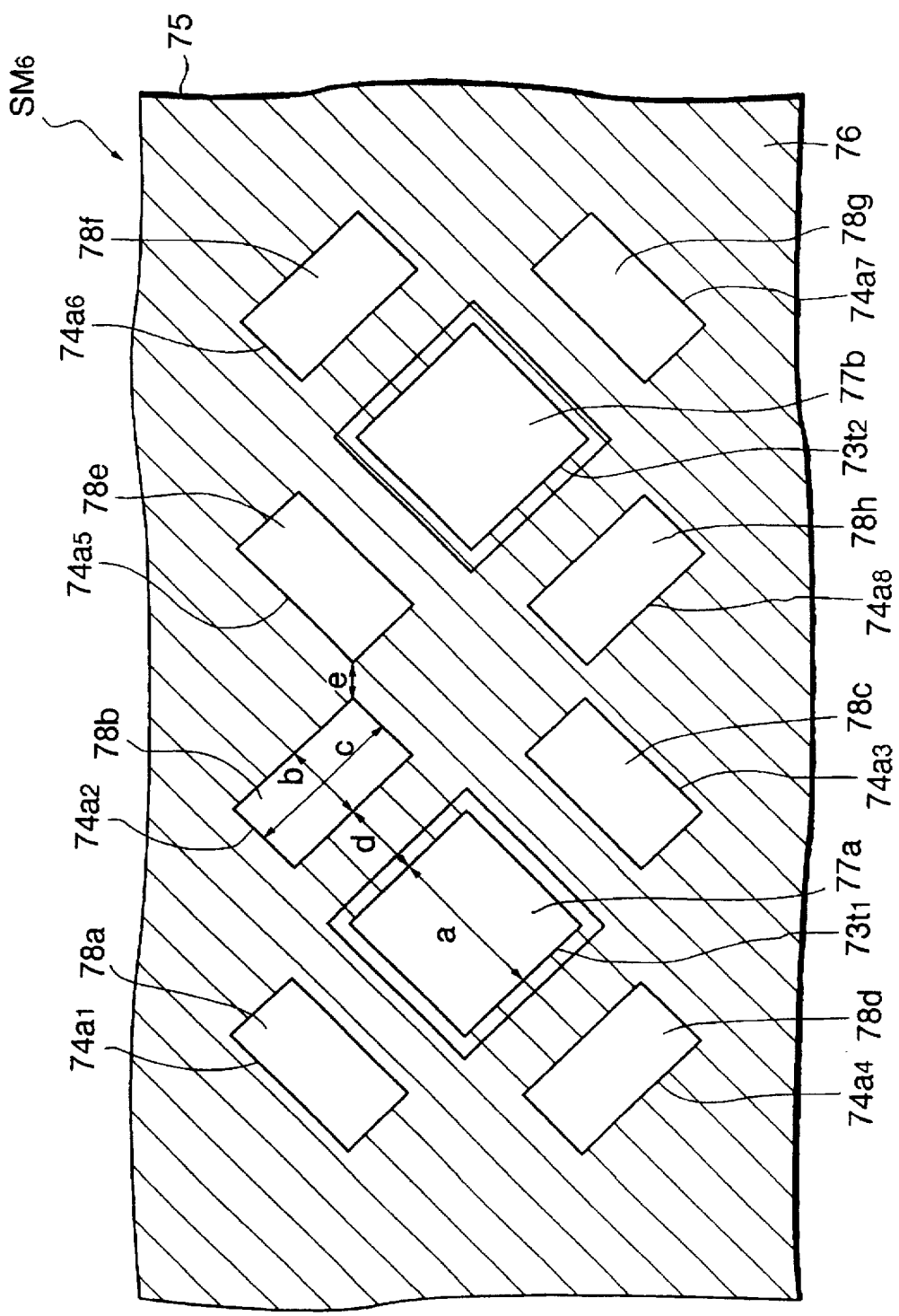
FIG. 26 is a plan view showing an essential portion of the phase shift mask that is formed by using the pattern of FIG. 24.

In the second embodiment, we describe, by referring to FIGS. 24 to 26, another method of arranging one target hole and auxiliary holes formed close to the four sides of the target hole, which are stored on target pattern data when generating the phase shift mask data.

FIG. 24 shows a hole arrangement of the second embodiment of this invention, in which one square target hole 69 and four rectangular auxiliary holes $70a_1$–$70a_4$ are arranged on the target pattern data, and in which one hole unit cell 71 comprising the target hole 69 and the four auxiliary holes $70a_1$–$70a_4$ is arranged on the layout data. Also shown in the figure is a superimposed view of the target hole 69, the auxiliary holes $70a_1$–$70a_4$ and the hole unit cell 71.

The target hole 69 and the auxiliary holes $70a_1$–$70a_4$ are arranged as shown by turning the square target hole 23 and the rectangular auxiliary holes $24a_1$–$24a_4$ of the first embodiment of FIG. 10 through approximately 45 degrees.

That is, if we let the length of one side of the target hole be a', the width and length of the auxiliary holes be b' and c' respectively, the distance between the target hole and the auxiliary holes be d', and the minimum distance between the adjoining auxiliary holes be e', then the length $L_2$ of each side of the hole unit cell 71 is expressed by the following equation (2).

$$L_2 = \frac{(a' + b' + d')}{\sqrt{2}} \times 2 + e' \quad (2)$$

This is shorter than the length $L_1$ of each side of the hole unit cell 25 of FIG. 10, which is expressed in equation (3). The two-dimensional size of the hole unit cell therefore can be reduced.

$$L_1 = a' + 2b' + 2d' + e' \quad (3)$$

The shifters, which are provided to produce a phase difference between the light that has passed through the target hole in the phase shift mask and the light that has passed through the auxiliary holes in the phase shift mask, are arranged either over the target hole or over the auxiliary holes.

FIG. 25 shows the conventional layout data on which the target holes and the auxiliary holes are laid out, and also the layout data on which the hole unit cells of the second embodiment of FIG. 24 are laid out. The intervals between the centers of the hole unit cells on the layout data of the second embodiment are equal to those of the centers of the target holes on the conventional layout data.

Although the use of the hole unit cells of the first embodiment reduces the mask pattern design time and the data processing time in the pattern data generation system and the electron beam aligner, the arrangement intervals of the hole unit cells are the same as those of the target holes in the conventional method as shown in FIG. 11.

On the other hand, with the hole unit cells of the second embodiment, not only is it possible to reduce the mask pattern design time and the data processing time but the intervals of the hole unit cells $72c_1$–$72c_6$ can be set shorter than those of the target holes $28t_1$–$28t_6$ of the conventional method, as shown in FIG. 25.

Next, an example is described in which the arrangement of the target hole and auxiliary holes of FIG. 24 is applied to the phase shift mask that is used in forming hole patterns 0.4 μm in diameter in the resist film coated over the semiconductor substrate.

The plan view of the phase shift mask $SM_6$ is shown in FIG. 26. In the figure, reference numeral 75 denotes a mask blank, 76 a light-shielding film, 77a and 77b shifters, and 78a–78h exposed portions of the mask blank. When a ⅕ reduction projection aligner is used, a sharp change in light intensity is produced on the resist film by adopting a design whereby, as in the conventional method, the target holes $73t_1$, $73t_2$ in the phase shift mask $SM_6$ are squares measuring 2.0 μm on each side a, the auxiliary holes $74a_1$–$74a_8$ are rectangles measuring 1.0 μm in width b and 2.0 μm in length c, and the distance d between the target hole and the auxiliary holes is 1.0 μm.

With this embodiment, even when the minimum distance e between the adjacent auxiliary holes, which in the conventional method must be 1.0 μm or more, is only 0.5 μm, no unwanted patterns are transferred onto what is originally intended to be the light-shielding areas of the resist film over the semiconductor substrate.

Hence, the minimum pitch g of the target holes on the phase shift mask $SM_6$ is given by $$p = \frac{(a + b + d)}{\sqrt{2}} \times 2 + e \quad (4)$$

$$= 5.7 \text{ μm} + 0.5 \text{ μm} = 6.2 \text{ μm}$$

In other words, the minimum pitch of the hole patterns formed on the resist film can be reduced to 1.23 μm or one-fifth of 6.2 μm, compared with 1.4 μm that is required by the conventional method of FIG. 1.

As described above, with the second embodiment, the target hole and the auxiliary holes located close to the target hole are so arranged that their sides are at an angle of about 45 degrees to the direction of arrangement of the adjacent target holes. This arrangement allows the two-dimensional size of the hole unit cells, each comprising the target hole and the auxiliary holes on the layout data, to be reduced. The intervals between the target holes formed on the phase shift mask can therefore be shortened, allowing the hole patterns, say, 0.4 μm across to be arranged on the resist film over the semiconductor substrate at 1.23 μm intervals.

(Embodiment 3)

A third embodiment of this invention offers another method of arranging one target hole and auxiliary holes located close to the four sides of the target hole, both stored on the target pattern data when generating the phase shift mask data. This is explained by referring to FIGS. 27 to 29.

Figure 27:
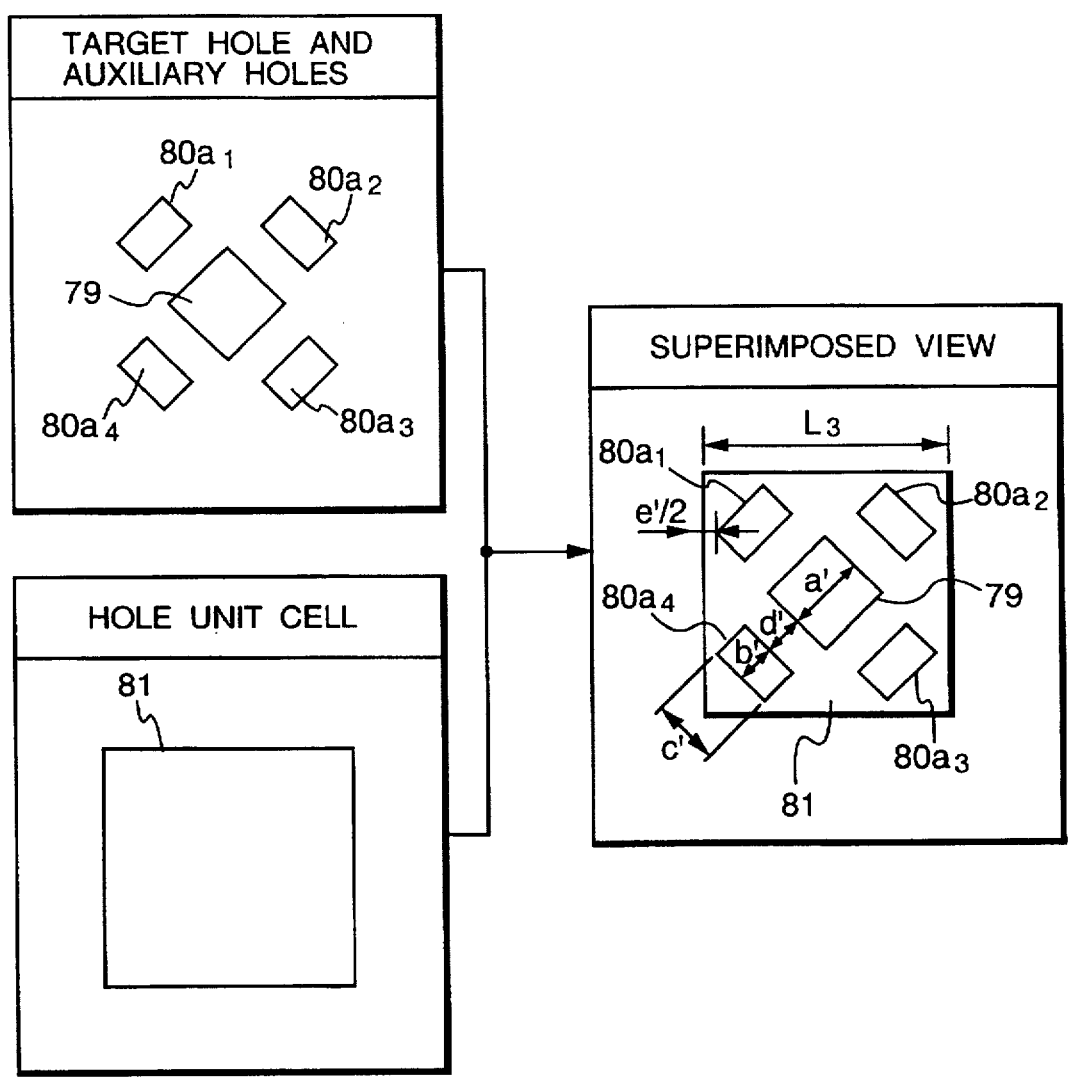
FIG. 27 is an explanatory view schematically showing another form of unit cell for hole that comprises a target hole and auxiliary holes.

FIG. 27 shows a hole arrangement of the third embodiment of this invention, in which one square target hole 79 and four rectangular auxiliary holes $80a_1$–$80a_4$ are arranged on target pattern data, and in which one hole unit cell 81 comprising the target hole 79 and the four auxiliary holes $80a_1$–$80a_4$ is arranged on the layout data. Also shown in the figure is a superimposed view of the target hole 79, the auxiliary holes $80a_1$–$80a_4$ and the hole unit cell 81.

The target hole 79 and the auxiliary holes $80a_1$–$80a_4$ are arranged as shown by turning the square target hole 23 and the rectangular auxiliary holes $24a_1$–$24a_4$ of the first embodiment of FIG. 10 through approximately 45 degrees, with the lengths c' of the auxiliary holes $80a_1$–$80a_4$ set shorter than the sides a' of the target hole 79.

That is, by making the length c' of the auxiliary holes shorter than the side a' of the target hole, in addition to rotating the target hole and auxiliary holes through 45 degrees, the side length $L_3$ of the hole unit cell 81 is shorter than the side length $L_2$ of the hole unit cell 71 of the second embodiment by an amount $\Delta L$, which is expressed as $$\Delta L = L_2 - L_3 \quad (5)$$
$$= \frac{(a'-c')}{\sqrt{2}}$$

The two-dimensional size of the hole unit cell therefore can be reduced.

The shifters, which are provided to produce a phase difference between the light that has passed through the target hole in the phase shift mask and the light that has passed through the auxiliary holes in the phase shift mask, are arranged either over the target hole or over the auxiliary holes.

Figure 28:
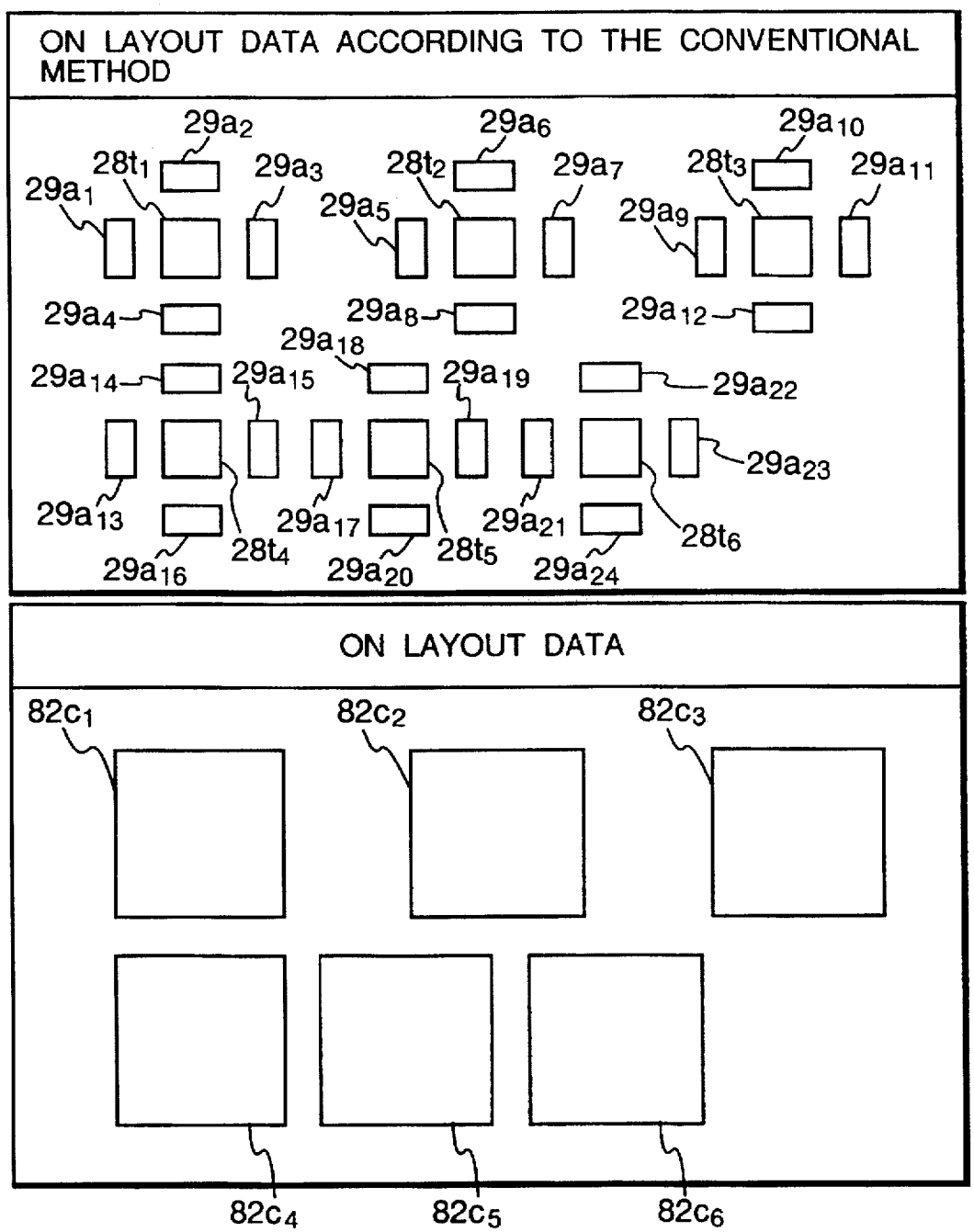
FIG. 28 is an explanatory view schematically showing a unit cell for hole stored on the layout data.

FIG. 28 shows the conventional layout data on which the target holes and the auxiliary holes are laid out, and also the layout data on which the hole unit cells of the third embodiment of FIG. 27 are laid out. The intervals between the centers of the hole unit cells on the layout data of the third embodiment are equal to those of the centers of the target holes on the conventional layout data.

With the hole unit cells of the third embodiment, it is possible to set the arrangement intervals of the hole unit cells $82c_1$–$82c_6$ shorter than those of the target holes $28t_1$–$28t_6$ of the conventional method, as shown in FIG. 28, in addition to reducing the mask pattern design time and the data processing time.

Next, an example is described in which the arrangement of the target hole and auxiliary holes of FIG. 27 is applied to the phase shift mask that is used in forming hole patterns 0.4 μm in diameter in the resist film coated over the semiconductor substrate.

Figure 29:
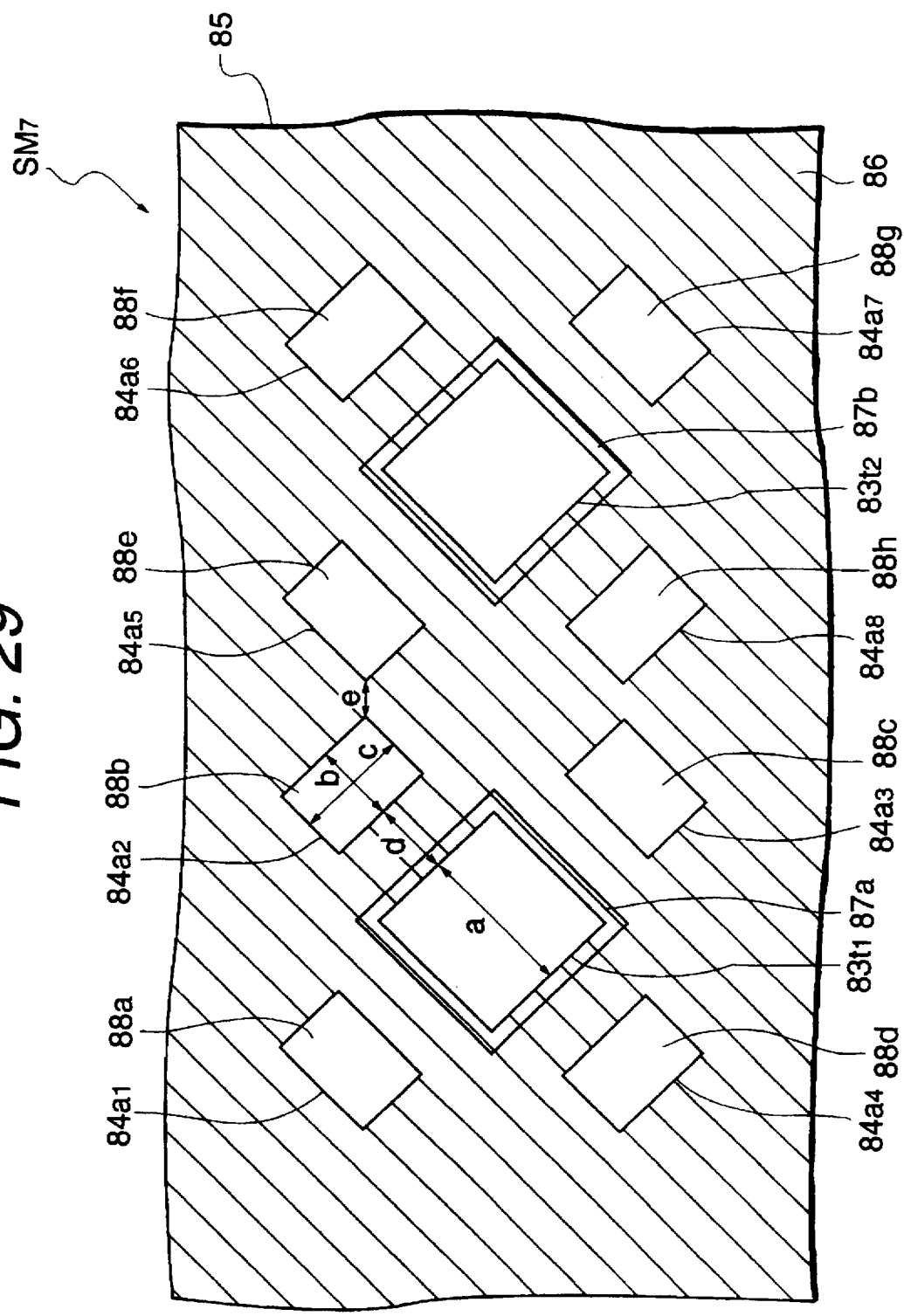
FIG. 29 is a plan view showing an essential portion of the phase shift mask that is formed by using the pattern of FIG. 27.

The plan view of the phase shift mask $SM_1$ is shown in FIG. 29. In the figure, reference numeral 85 denotes a mask blank, 86 a light-shielding film, 87a and 87b shifters, and 88a–88h exposed portions of the mask blank. When a ⅕ reduction projection aligner is used, a design is adopted whereby, as in the conventional method, the target holes $83t_1$, $83t_2$ in the phase shift mask $SM_1$ are squares measuring 2.0 μm on each side a, the auxiliary holes $84a_1$–$84a_8$ are rectangles measuring 1.0 μm in width b, the distance d between the target hole and the auxiliary holes is 1.0 μm, and the minimum distance e between the adjacent auxiliary holes is 0.5 μm.

The length c of the auxiliary holes $84a_1$–$84a_8$, which was set at 2.0 μm in the conventional method, however, is set at 1.5 μm in this design.

Hence, the minimum pitch p of the target holes on the phase shift mask $SM_1$ is therefore 5.8 μm from equation (5).

That is, the minimum pitch of the hole patterns formed in the resist film can be reduced to 1.16 μm or one-fifth of 5.8 μm, compared with 1.4 μm that is required by the conventional method of FIG. 1.

As described above, with the third embodiment, the target hole and the auxiliary holes located close to the target hole are so arranged that their sides are at an angle of about 45 degrees to the direction of arrangement of the adjacent target holes, and the length of the auxiliary holes is set shorter than the side of the target hole. This arrangement allows the two-dimensional size of the hole unit cells, each comprising the target hole and the auxiliary holes on the layout data, to be reduced. The intervals between the target holes formed on the phase shift mask can therefore be shortened, allowing the hole patterns, say, 0.4 μm across to be arranged on the resist film over the semiconductor substrate at 1.16-μm intervals.

(Embodiment 4)

A fourth embodiment of this invention offers a further method of arranging one target hole and auxiliary holes located close to the four sides of the target hole, both stored on the target pattern data when generating the phase shift mask data. This is explained by referring to FIGS. 30 to 32.

Figure 30:
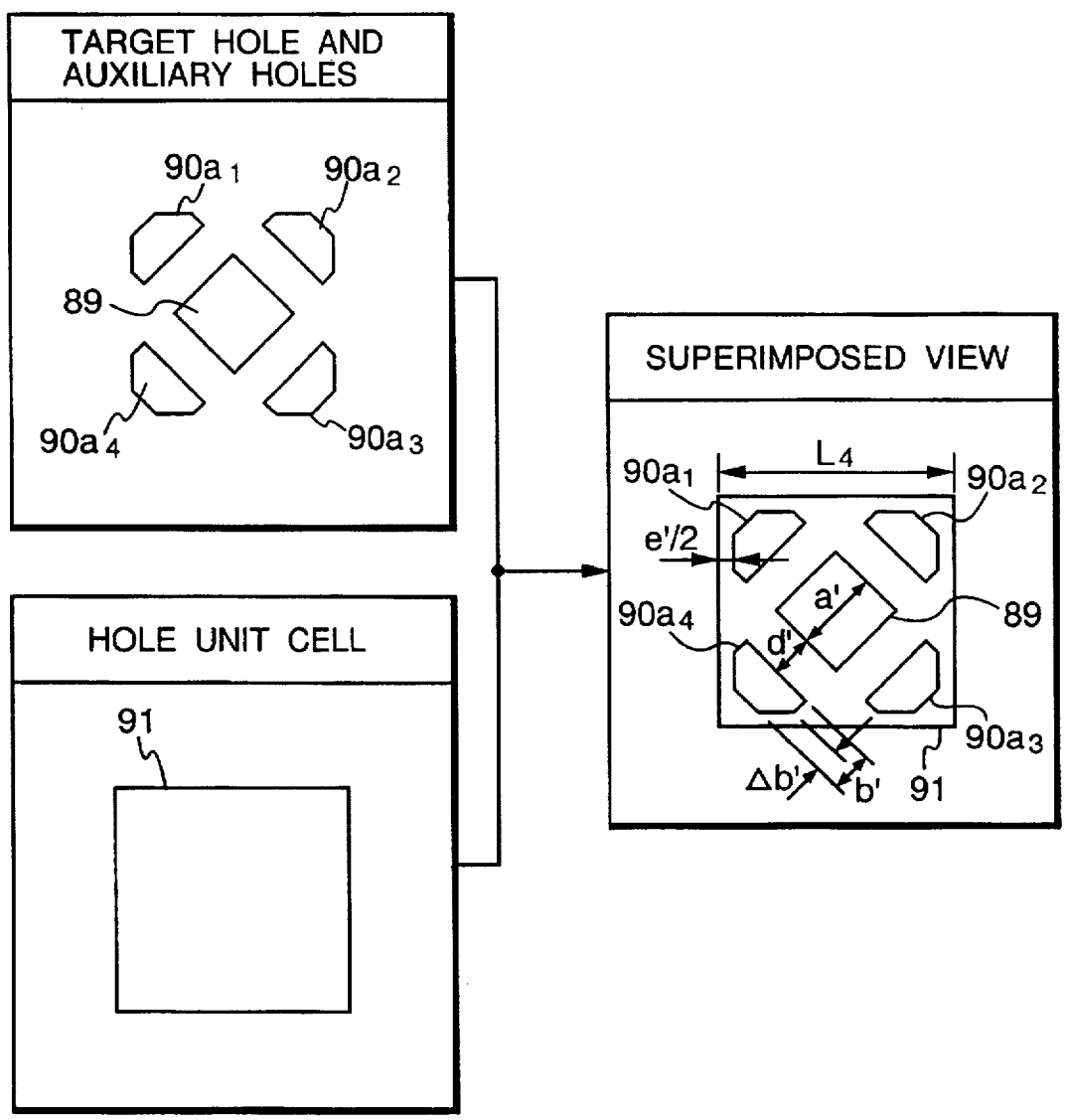
FIG. 30 is an explanatory view schematically showing another form of unit cell for hole that comprises a target hole and auxiliary holes.

FIG. 30 shows a hole arrangement of the fourth embodiment of this invention, in which one square target hole 89 and four rectangular auxiliary holes $90a_1$–$90a_4$ are arranged on target pattern data, and in which one hole unit cell 91 comprising the target hole 89 and the four auxiliary holes $90a_1$–$90a_4$ is arranged on the layout data. Also shown in the figure is a superimposed view of the target hole 89, the auxiliary holes $90a_1$–$90a_4$ and the hole unit cell 91.

The target hole 89 and the auxiliary holes $90a_1$–$90a_4$ are arranged as shown by turning the square target hole 23 and the rectangular auxiliary holes $24a_1$–$24a_4$ of the first embodiment of FIG. 10 through about 45 degrees and by cutting off at an angle of about 45 degrees those corners of the rectangular auxiliary holes that are situated on the outside with respect to the target hole 89 to make the auxiliary holes polygons.

That is, to produce a sharp change in light intensity on the resist film by causing the light that has passed through the target hole on the phase shift mask and the light that has passed through the auxiliary holes on the phase shift mask to interfere with each other, the side of the auxiliary holes that faces the target hole is not shortened in reducing the area of the auxiliary holes.

Let a' stand for the side of the target hole, d' for the distance between the target hole and the auxiliary holes, e' for the minimum distance between the adjacent auxiliary holes, and $\Delta b'$ for the amount of reduction from the width b' of the auxiliary holes. The length $L_4$ of each side of the hole unit cell 91 therefore is shorter than the length $L_3$ of each side of the hole unit cell 81 of the third embodiment by an amount $\Delta L$, which is given by $$\Delta L = L_3 - L_4 \quad (6)$$
$$= \frac{\Delta b'}{\sqrt{2}} \times 2$$

The two-dimensional size of the hole unit cell therefore can be reduced.

When the amount of reduction $\Delta b'$ is equal to the width b' of the rectangular auxiliary holes, the side of the hole unit cells 91 can be expressed as $$L_4 = \frac{(a'+d')}{\sqrt{2}} \times 2 + e' \quad (7)$$

The shifters, used to produce a phase difference between the light that has passed through the target hole in the phase shift mask and the light that has passed through the auxiliary holes in the phase shift mask, are provided either over the target hole or over the auxiliary holes.

Figure 31:
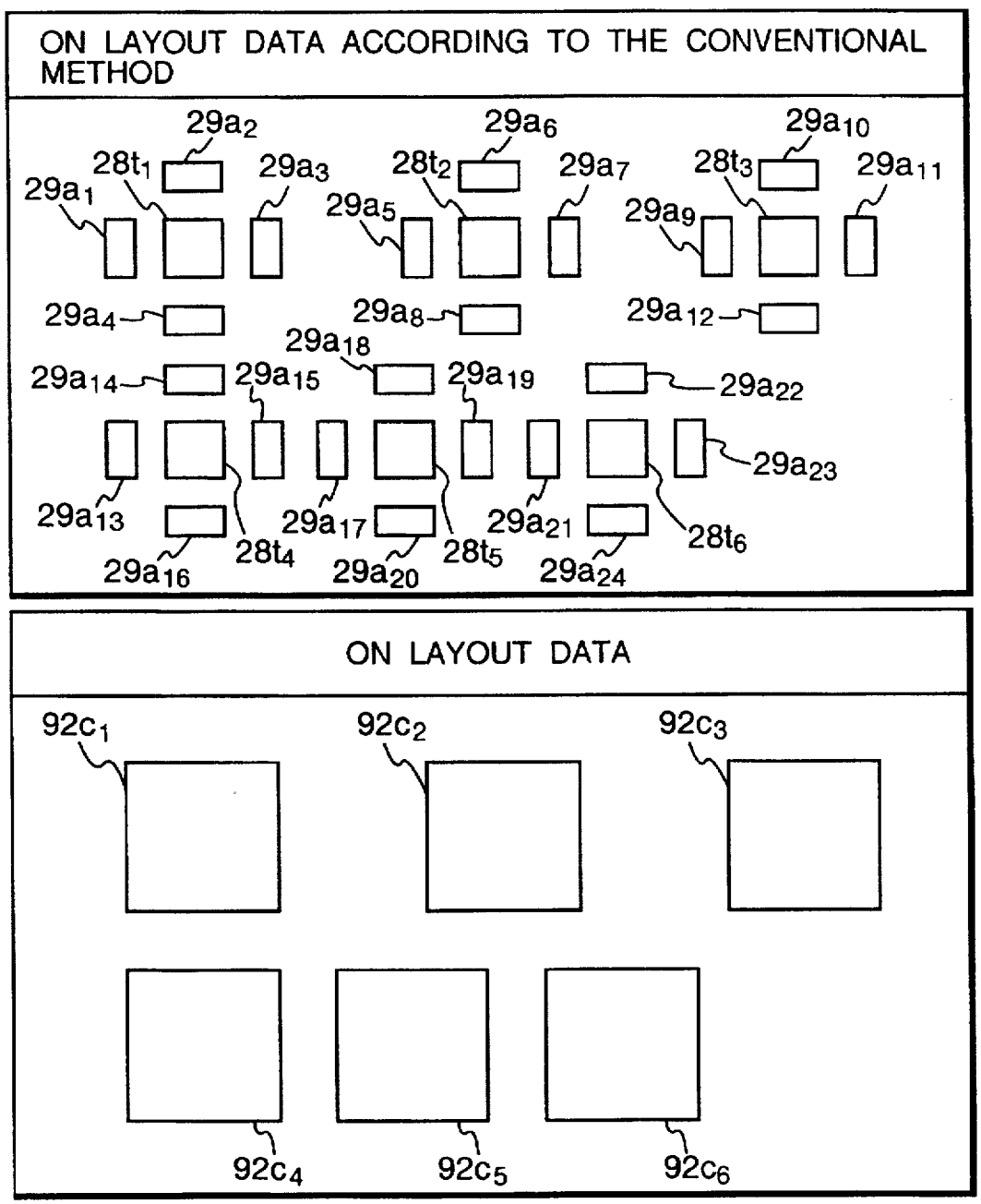
FIG. 31 is an explanatory view schematically showing a unit cell for hole stored on the layout data.

FIG. 31 shows the conventional layout data on which the target holes and the auxiliary holes are laid out, and also the layout data on which the hole unit cells of the fourth embodiment of FIG. 30 are laid out. The intervals between the centers of the hole unit cells on the layout data of the fourth embodiment are equal to those of the centers of the target holes on the conventional layout data.

With the hole unit cells of the fourth embodiment, it is possible to set the arrangement intervals of the hole unit cells $92c_1$–$92c_6$ shorter than those of the target holes $28t_1$–$28t_6$ of the conventional method, as shown in FIG. 31, in addition to reducing the mask pattern design time and the data processing time.

Next, an example case is explained in which the arrangement of the target hole and auxiliary holes of FIG. 30 is applied to the phase shift mask that is used in forming hole patterns 0.4 µm in diameter in the resist film coated over the semiconductor substrate.

Figure 32:
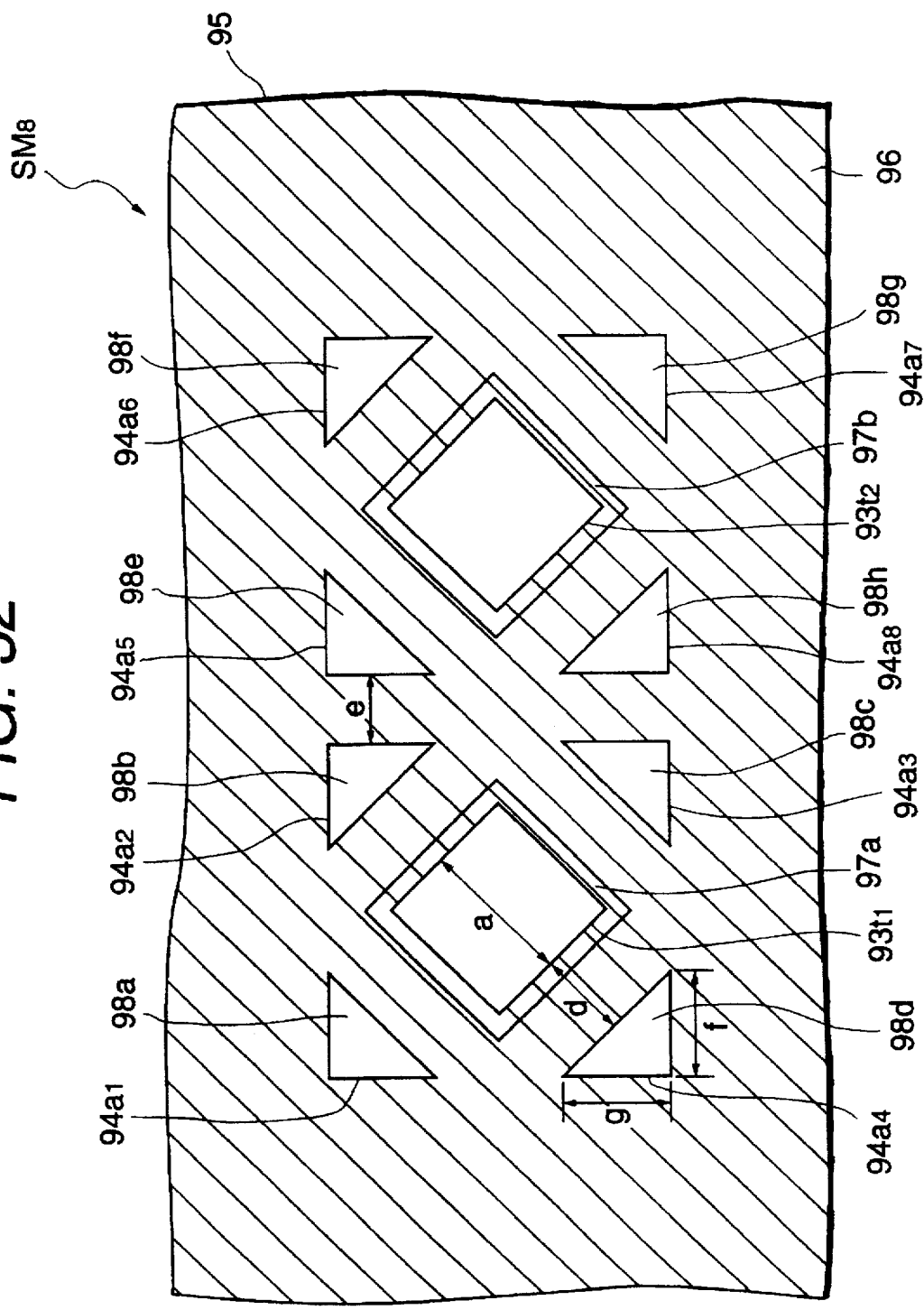
FIG. 32 is a plan view showing an essential portion of the phase shift mask that is formed by using the pattern of FIG. 30.

The plan view of the phase shift mask $SM_8$ is shown in FIG. 32. In the figure, reference numeral 95 denotes a mask blank, 96 a light-shielding film, 97a and 97b shifters, and 98a–98h exposed portions of the mask blank. When a ⅕ reduction projection aligner is used, a design is adopted whereby the target holes $93t_1$, $93t_2$ in the phase shift mask $SM_8$ are squares measuring 2.0 µm on each side a, the auxiliary holes $94a_1$–$94a_8$ are triangles measuring 1.0 µm in base f and 1.0 µm in height g, and the distance d between the target hole and the auxiliary holes is 1.0 µm.

Thus, the minimum pitch p of the target holes on the phase shift mask $SM_8$ is given by $$p = \frac{(a+d)}{\sqrt{2}} \times 2 + e \qquad (8)$$

Even when the minimum distance e between the adjacent auxiliary holes is 1.0 µm, the minimum pitch p of the target holes on the phase shift mask $SM_8$ is 5.2 µm.

That is, the minimum pitch of the hole patterns formed in the resist film can be reduced to 1.05 µm or one-fifth of 5.24 µm, compared with 1.4 µm that is required by the conventional method of FIG. 1.

Because the area of the auxiliary holes is smaller than the conventional rectangular auxiliary holes, the distance d between the target hole and the auxiliary holes and the minimum distance e between the adjacent auxiliary holes can be made shorter than the above design values.

Suppose that the distance d between the target hole and the auxiliary holes and the distance e between the adjacent auxiliary holes are set at 0.9 µm. Then, the minimum pitch p of the target holes on the phase shift mask $SM_8$ is 5.00 µm, allowing the minimum pitch of the hole patterns formed on the resist film to be reduced to 1.00 µm or one-fifth of 5.00 µm.

In this way, with the fourth embodiment, the target holes are so arranged that their sides are at an angle of about 45 degrees to the direction of arrangement of the adjacent target holes, and the auxiliary holes located close to the four sides of the target hole are made polygons by cutting off at an angle of about 45 degrees those corners of the rectangular auxiliary holes that are situated on the outside with respect to the target hole. This arrangement allows the two-dimensional size of the hole unit cells, each comprising the target hole and the auxiliary holes on the layout data, to be reduced. For example, the hole patterns 0.4 µm across can be arranged on the resist film over the semiconductor substrate at 1.00-µm intervals.

(Embodiment 5)

A fifth embodiment of this invention offers a further method of arranging one target hole and auxiliary holes located close to the four sides of the target hole, both stored on the target pattern data when generating the phase shift mask data. This is explained by referring to FIGS. 33 to 38.

Figure 33:
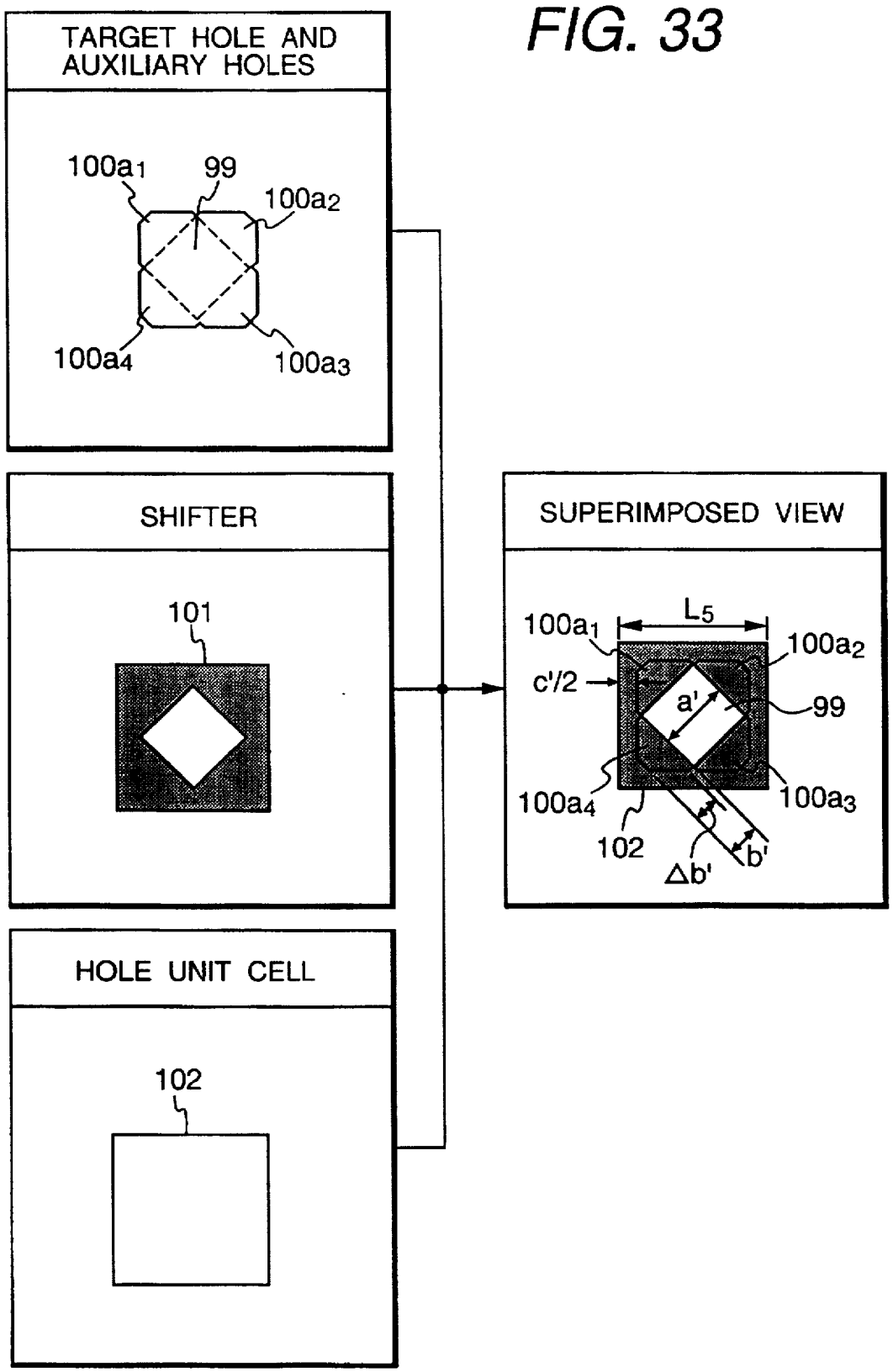
FIG. 33 is an explanatory view schematically showing another form of unit cell for hole that comprises a target hole and auxiliary holes.

FIG. 33 shows a hole arrangement of the fifth embodiment of this invention, in which one square target hole 99 and four auxiliary holes $100a_1$–$100a_4$ are arranged on target pattern data; in which a shifter 101 is arranged on phase shift pattern data; and in which one hole unit cell 102 comprising the target hole 99 and the four auxiliary holes $100a_1$–$100a_4$ is arranged on the layout data. Also shown in the figure is a superimposed view of the target hole 99, the auxiliary holes $100a_1$–$100a_4$, the shifter 101 and the hole unit cell 102.

The target hole 99 and the auxiliary holes $100a_1$–$100a_4$ are arranged as shown by turning the square target hole 23 and the rectangular auxiliary holes $24a_1$–$24a_4$ of the first embodiment of FIG. 10 through about 45 degrees and by cutting off at an angle of about 45 degrees those corners of the rectangular auxiliary holes that are situated on the outside with respect to the target hole 99 to make the auxiliary holes polygons.

The auxiliary holes $100a_1$–$100a_4$ are in contact with each side of the target hole 99, and these holes are integrated into a hole unit cell 102.

Let a' stand for one side of the target hole and d' for the distance between the target hole and the auxiliary holes. Then, the length $L_5$ of one side of the hole unit cell 102 is shorter than the length $L_4$ of the hole unit cell 91 of the fourth embodiment by an amount ΔL, which is expressed as $$\begin{aligned}\Delta L &= L_4 - L_5 \\ &= \frac{\Delta d'}{\sqrt{2}} \times 2\end{aligned} \qquad (9)$$

The two-dimensional size of the hole unit cell therefore can be reduced.

Because the target hole and the auxiliary holes contact each other, one pattern data made up of the target hole and the auxiliary holes is stored on the target pattern data, as shown in FIG. 33.

The shifters, used to produce a phase difference between the light that has passed through the target hole in the phase shift mask and the light that has passed through the auxiliary holes in the phase shift mask, are provided either over the target hole or over the auxiliary holes. FIG. 33 shows the shifter to be provided over the auxiliary holes.

Figure 34:
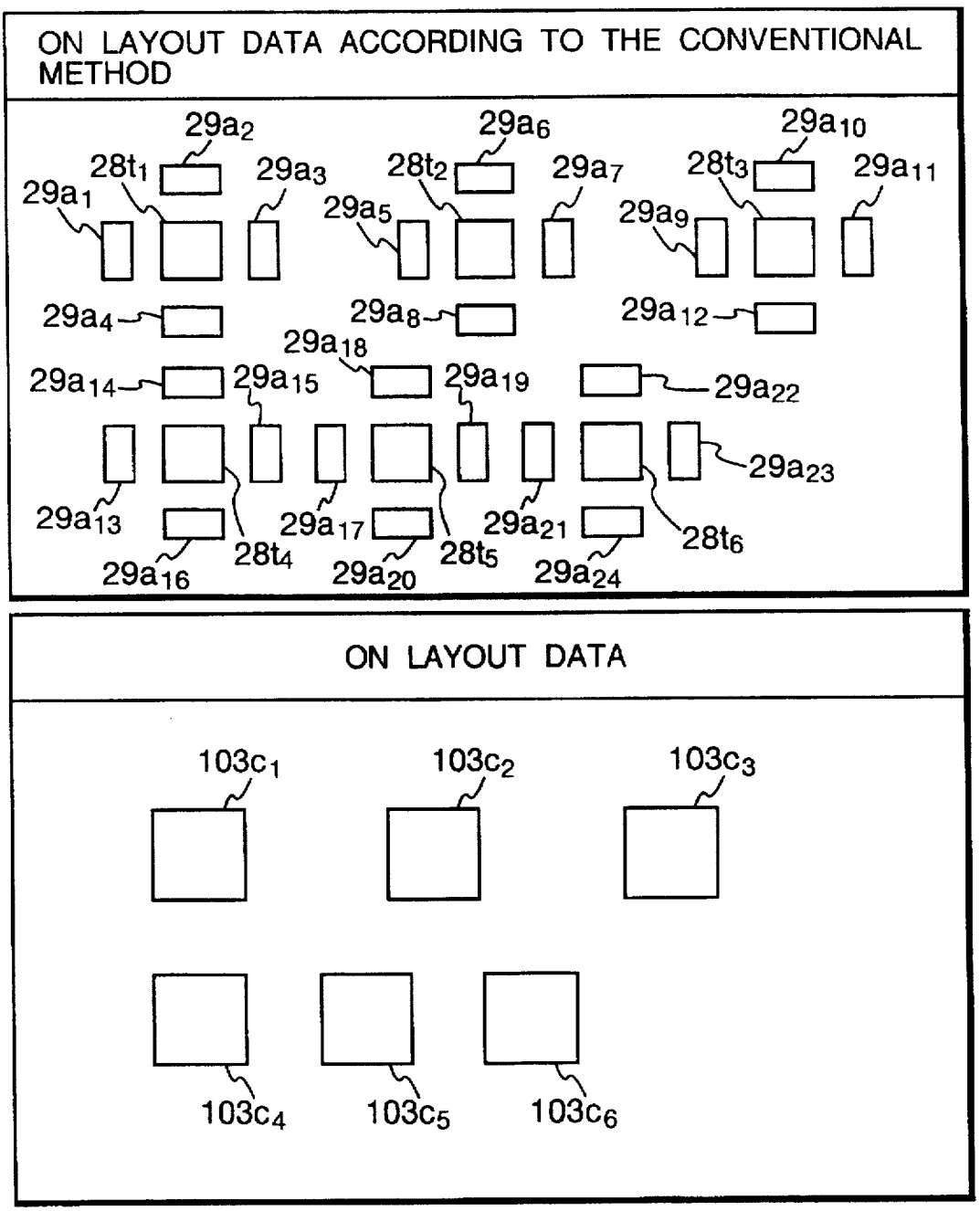
FIG. 34 is an explanatory view schematically showing a unit cell for hole stored on the layout data.

FIG. 34 shows the conventional layout data on which the target holes and the auxiliary holes are laid out, and also the layout data on which the hole unit cells of the fifth embodiment of FIG. 33 are laid out. The intervals between the centers of the hole unit cells on the layout data of the fifth embodiment are equal to those of the centers of the target holes on the conventional layout data.

With the hole unit cells of the fifth embodiment, it is possible to set the arrangement intervals of the hole unit cells $103c_1$–$103c_6$ shorter than those of the target holes $28t_1$–$28t_6$ of the conventional method, as shown in FIG. 34, in addition to reducing the mask pattern design time and the data processing time.

Next, an example case is explained in which the arrangement of the target hole and auxiliary holes of FIG. 33 is applied to the phase shift mask that is used in forming hole patterns 0.4 µm in diameter in the resist film coated over the semiconductor substrate.

Figure 35:
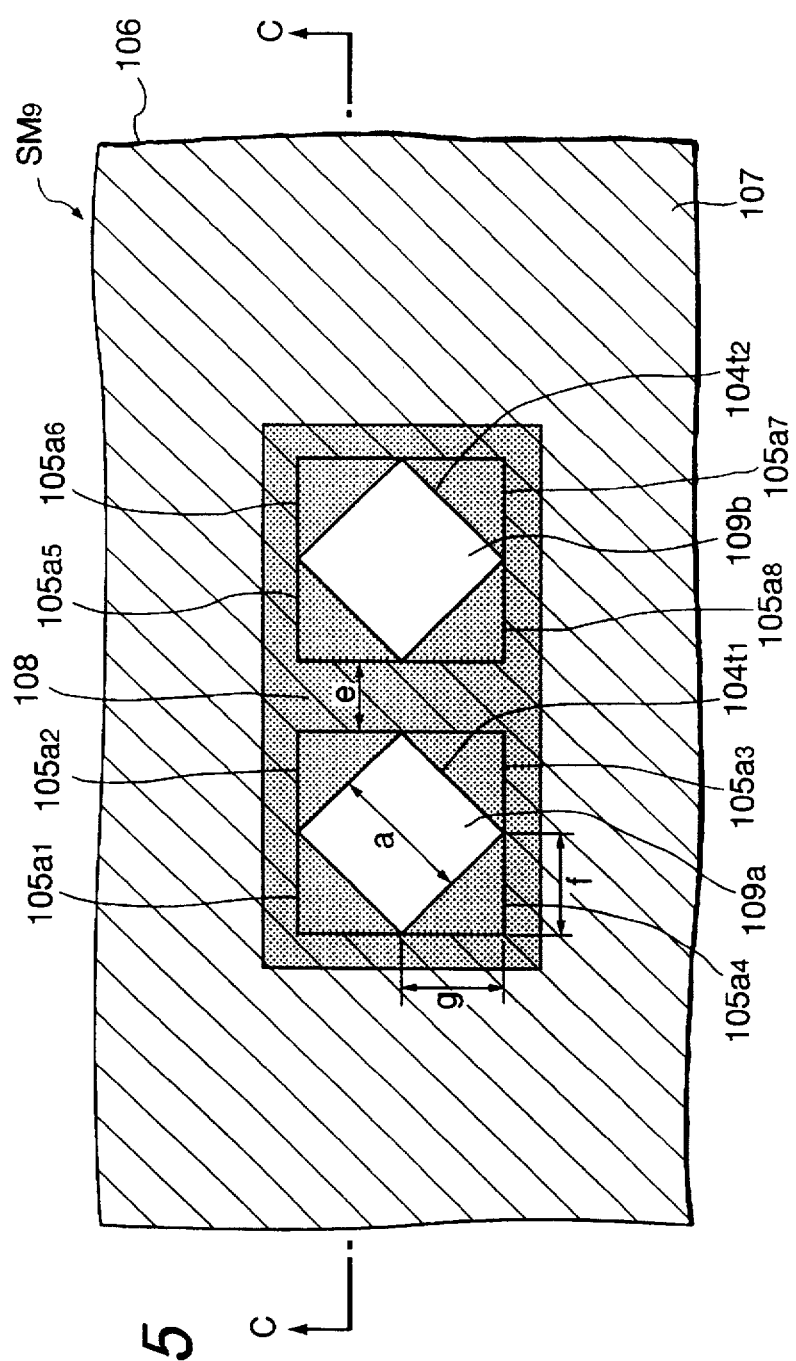
FIG. 35 is a plan view showing an essential portion of the phase shift mask that is formed by using the pattern of FIG. 33.
Figure 36:
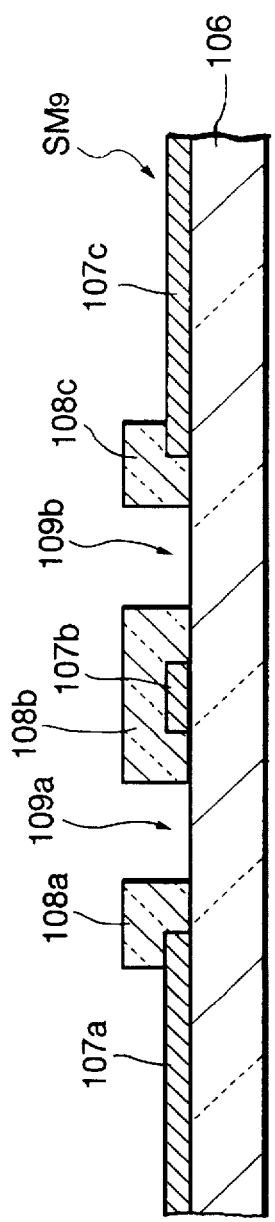
FIG. 36 is an essential-part cross section of the phase shift mask of FIG. 35 taken along the line C—C.

The plan view of the phase shift mask $SM_9$ is shown in FIG. 35 and its cross section in FIG. 36. In the figure, reference numeral 106 denotes a mask blank, 107 and 107a–107c light-shielding films, 108 and 108a–108c shifters, and 109a and 109b exposed portions of the mask blank. When a ⅕ reduction projection aligner is used, a design is adopted whereby the target holes $104t_1$, $104t_2$ in the phase shift mask $SM_9$ are squares measuring 2.0 μm on each side a and the auxiliary holes $105a_1$–$105a_8$ are triangles measuring 1.0 μm in base f and 1.0 μm in height g.

The minimum pitch p of the target holes on the phase shift mask $SM_9$ is expressed as $$p = \frac{a}{\sqrt{2}} \times 2 + e \tag{10}$$

Even when the minimum distance e between the adjacent auxiliary holes is 1.0 μm, the minimum pitch p of the target holes on the phase shift mask $SM_9$ is 3.8 μm.

That is, the minimum pitch of the hole patterns formed in the resist film can be reduced to 0.77 μm or one-fifth of 3.83 μm, compared with 1.4 μm that is required by the conventional method of FIG. 1.

Figure 37:
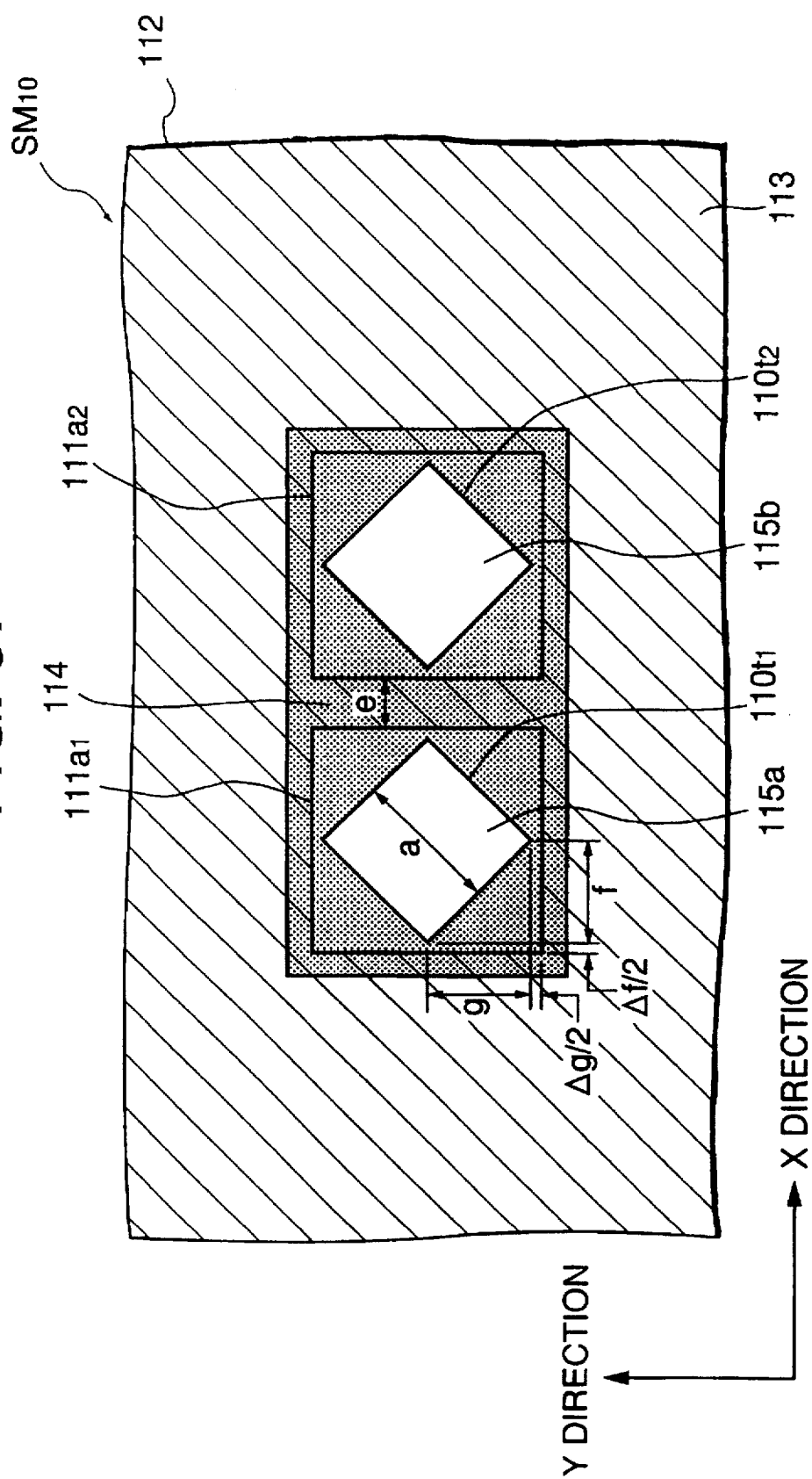
FIG. 37 is a plan view showing an essential portion of another phase shift mask that is formed by using the pattern of FIG. 33.

To improve the light-shielding efficiency of an area between the adjacent target holes in the phase shift mask, it is possible, as shown in FIG. 37, to set the area of the auxiliary holes $111a_1$, $111a_2$ greater than the area of the auxiliary holes $105a_1$–$105a_8$ of FIG. 35 while leaving the length of each side of the target holes $110t_1$, $110t_2$ to be 1.0 μm, the same length of the target holes $104t_1$, $104t_2$ of FIG. 35. In the figure, reference number 112 designates a mask blank, 113 a light-shielding film, 114 a shifter, and 115a and 115b exposed portions of the mask blank.

If we let an increment of auxiliary holes in the X direction be Δf (and an increment in the Y direction be Δg), as shown in FIG. 37 then the minimum pitch p of the target holes in the X direction on the phase shift mask $SM_{10}$ is expressed as $$p = \frac{a}{\sqrt{2}} \times 2 + e + 2\Delta f \tag{11}$$

This minimum pitch p is greater than the minimum pitch of equation (10).

However, even when the increment Δf is 0.5 μm on the phase shift mask $SM_{10}$, the minimum pitch of the hole patterns formed on the resist film is 0.77 μm+0.2 μm=0.97 μm, which is below 1.0 μm.

Figure 38:
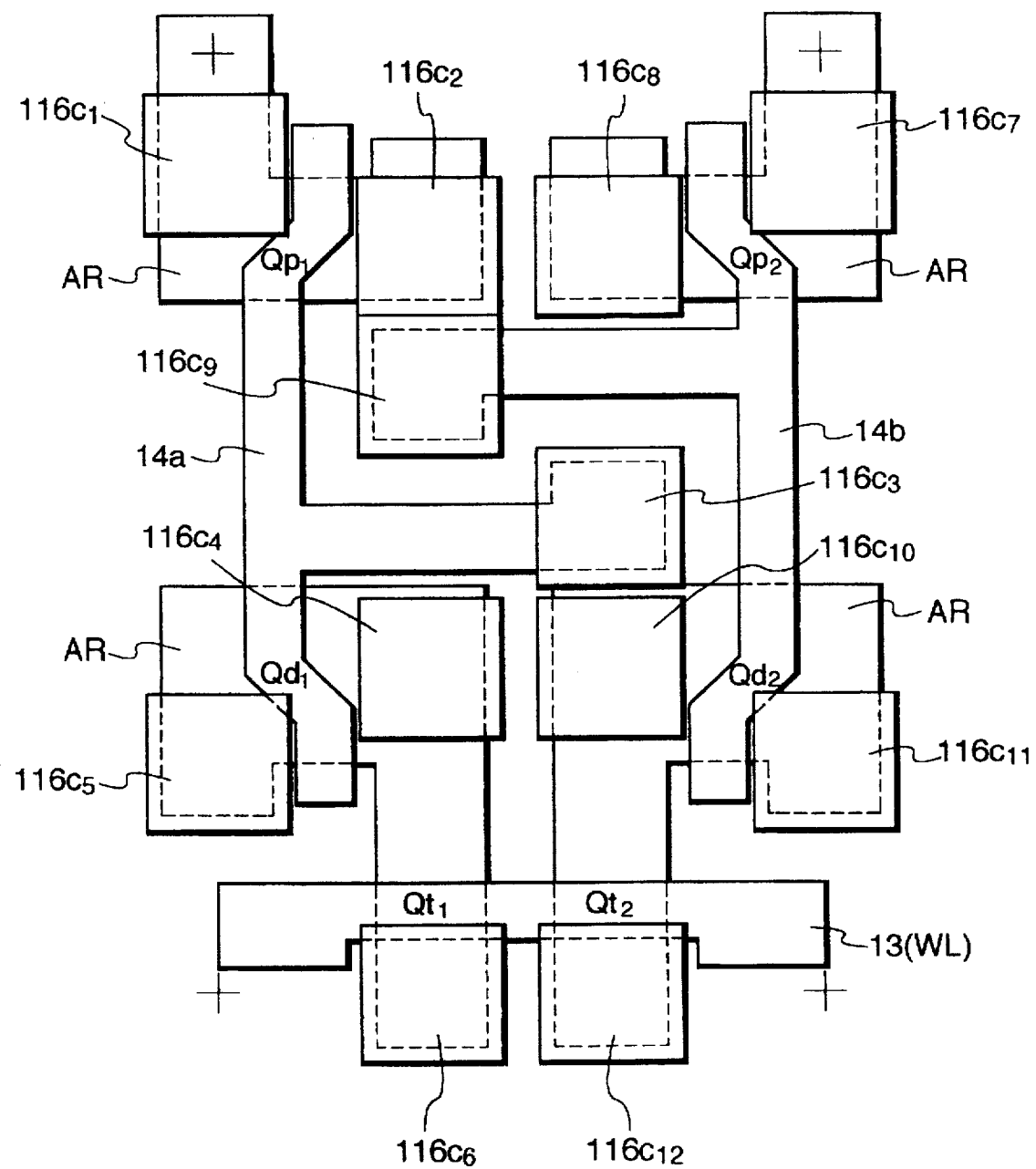
FIG. 38 is a pattern layout of an SRAM memory cell when a phase shift mask is used.

Next, an example case is described in which the hole unit cell of the fifth embodiment is applied to the layout design of SRAM memory cells. FIG. 38 shows a pattern layout of SRAM memory cell.

Figure 6:
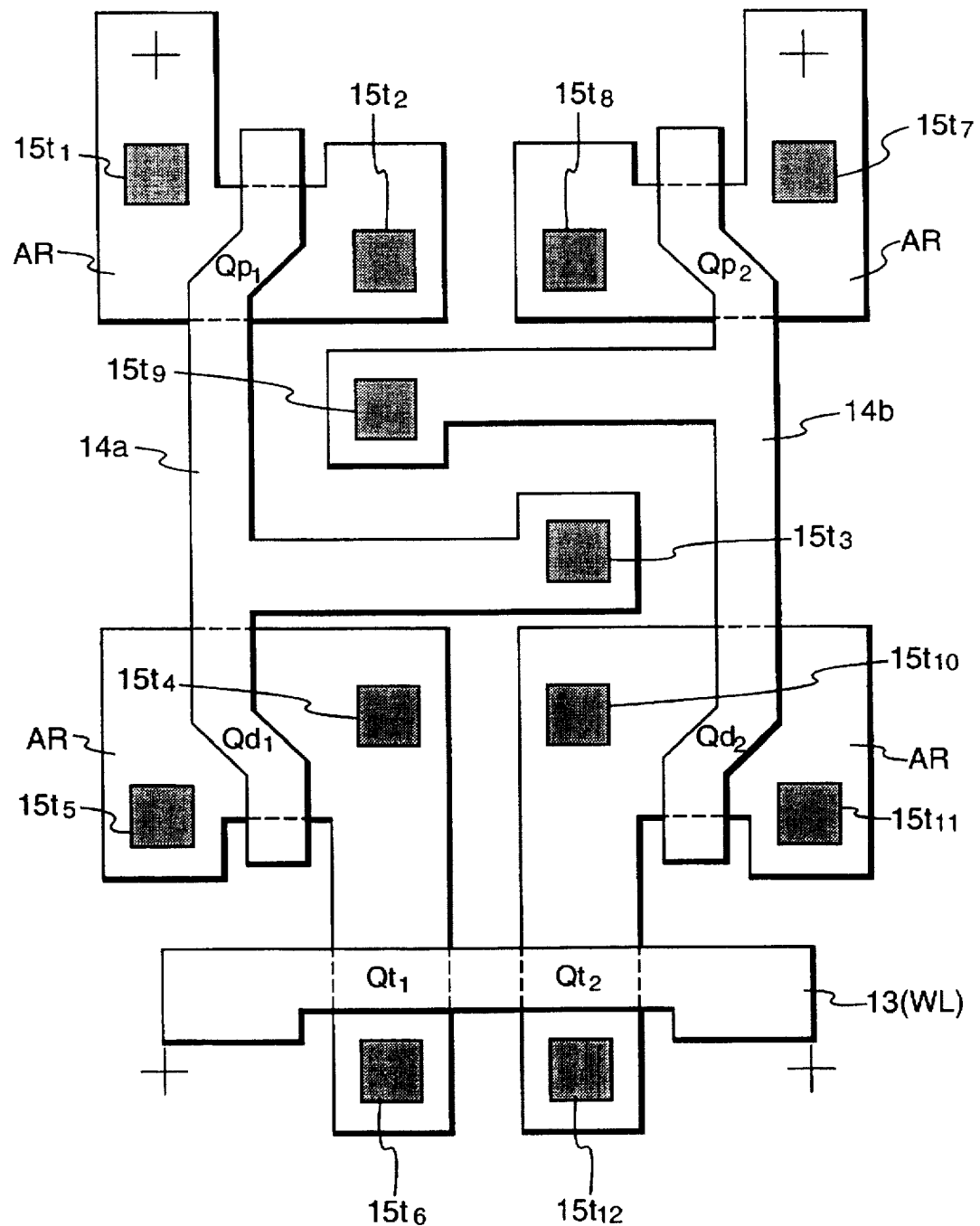
FIG. 6 is a pattern layout of an SRAM memory cell when a conventional mask without auxiliary holes is used.

The figure, as in the case of FIG. 6, shows in a combined state components of a memory cell including active regions AR, a gate electrode (word line WL) of transfer MISFETs $Ot_1$, $Ot_2$, and gate electrodes $14a$, $14b$ of drive MISFETs $0d_1$, $0d_2$ and load MISFETs $Op_1$, $Op_2$. Also shown are hole unit cells $116c_1$–$116c_{12}$ used to form contact holes, 0.4 μm across, on the active regions AR and gate electrodes $14a$, $14b$. One memory cell measures 4.2 μm×6.8 μm.

Figure 7:
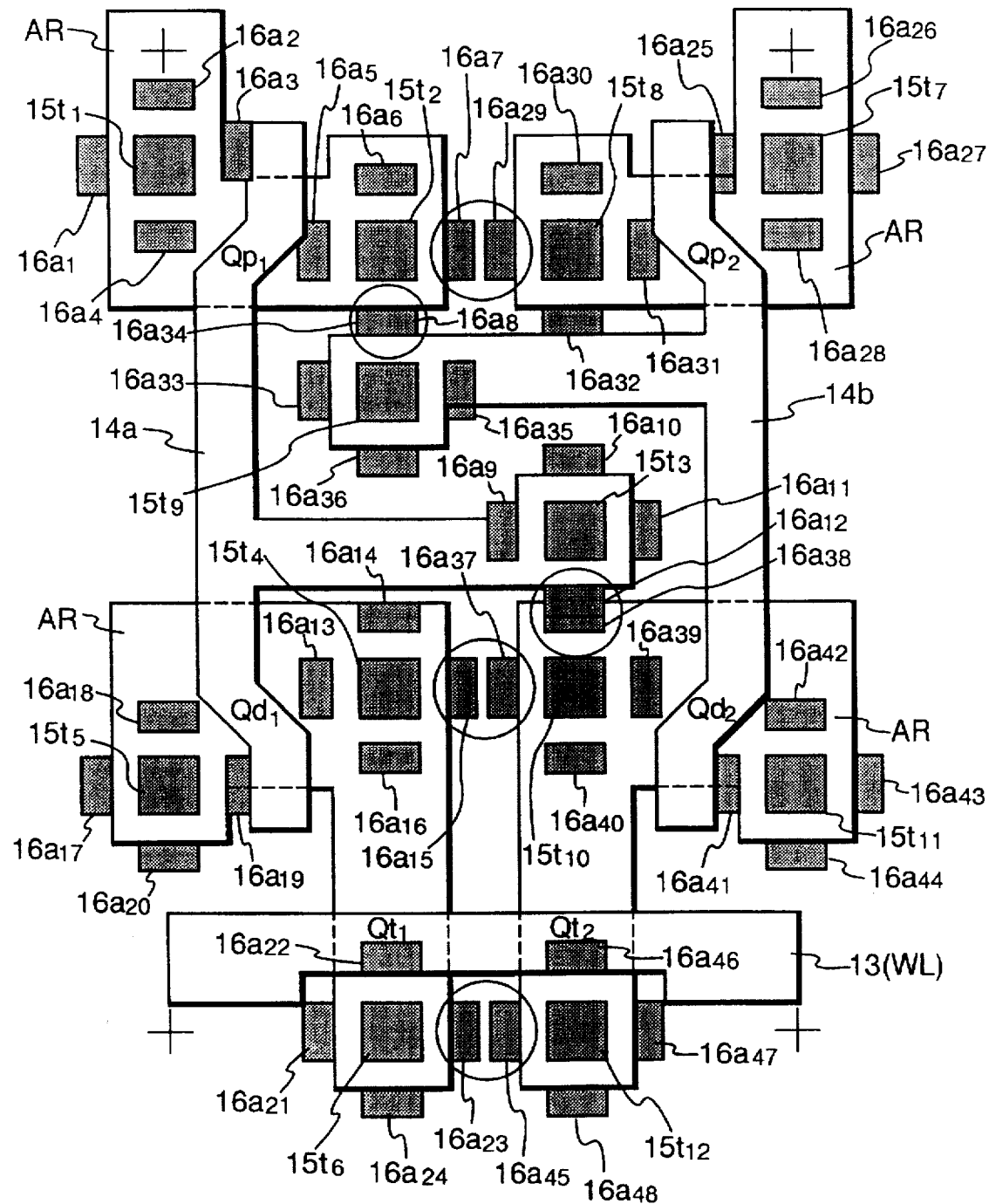
FIG. 7 is a pattern layout of an SRAM memory cell when a phase shift mask is used.

The hole unit cells $116c_1$–$116c_{12}$ are arranged so that their centers are aligned with the centers of the target holes $15t_1$–$15t_{12}$ of FIG. 7. The use of the phase shift mask $SM_9$ having the arrangement of target hole and auxiliary holes shown in FIG. 35 allows hole patterns to be formed on the resist film at intervals of less than 1.00 μm. Hence, the size of the hole unit cells $116c_1$–$116c_{12}$ is set to 1.0 μm×1.0 μm.

As shown in FIG. 38, the number of patterns required to form one contact hole in the resist film coated over the semiconductor substrate is one hole unit cell. Hence, the number of data required to form the contact holes in one memory cell is the sum of 12 hole unit cell data and 12 shifter data, or 24 data. In this way, an increase in the number of data can be minimized.

Even when the distance between the adjacent target holes is 1.0 μm, the use of the geometry and arrangement of the target hole and auxiliary holes of the fifth embodiment makes it possible to prevent unwanted patterns produced by the closely adjoining auxiliary holes from being transferred onto the resist film coated over the semiconductor substrate.

Therefore, the hole unit cells can be arranged not only in areas where the distance between adjacent target holes is wide but in areas where the distance is as narrow as 1.0 μm, facilitating the design of the mask pattern for memory cells.

In the fifth embodiment, the target holes are so arranged that their sides are at an angle of about 45 degrees to the direction of arrangement of the adjacent target holes, the auxiliary holes located close to the four sides of the target hole are made polygons by cutting off at an angle of about 45 degrees those corners of the rectangular auxiliary holes that are situated on the outside with respect to the target hole, and the auxiliary holes are placed in contact to the sides of the target hole. This arrangement allows the two-dimensional size of the hole unit cells, each comprising the target hole and the auxiliary holes on the layout data, to be reduced. This in turn makes it possible to reduce the distance between the target holes formed on the phase shift mask. For example, the hole patterns 0.4 μm across can be arranged on the resist film over the semiconductor substrate at intervals of 1.00 μm or less.

The present invention has been described in detail in conjunction with example embodiments. It is noted that the invention is not limited to these embodiments and that various modifications may be made without departing from the spirit of this invention.

For example, while the preceding embodiments concern the case where the invention is applied to the hole patterns 0.4 μm in diameter formed in the resist film coated over the semiconductor substrate, the invention is applicable to any hole pattern formed by the phase shift mask, irrespective of the hole pattern diameters.

In the preceding embodiments, explanation concerns the case where the same hole unit cells are applied to the contact holes used to connect semiconductor devices of SRAM memory cell and interconnect layers. The same hole unit cells can also be arranged in peripheral circuits in addition to the memory cell, making it possible to produce all contact holes on one layout data with a single hole unit cell.

While the preceding embodiments concern the case where the same hole unit cells are applied to the contact holes used to connect semiconductor devices of SRAM memory cell and interconnect layers, it is possible to apply the same hole unit cells to other hole patterns, such as through holes for connecting overlying and underlying interconnect layers. With this arrangement, all the hole groups on different layout data can be formed by a single hole unit cell.

While the preceding embodiments describe the case where the hole unit cells are applied to SRAM memory cell, they are applicable to any semiconductor integrated circuit devices.

Representative advantages of this invention may be briefly summarized as follows.

With this invention it is possible to reduce the phase shift mask design time and data processing time by generating the phase shift mask layout data and the mask exposure data by using the hole unit cells, each comprising a target hole and auxiliary holes located close to the four sides of the target hole. This in turn minimizes an increase in the design and manufacture times required for making phase shift masks.

Further, by using a variety of arrangements and geometries of the target hole and auxiliary holes located close to the four sides of the target hole, it is possible to reduce the two-dimensional size of the hole unit cells and produce a phase shift mask with reduced intervals between the hole groups. This allows hole patterns to be formed on the resist film coated over the semiconductor wafer at narrower intervals. This in turn enhances the integration level of semiconductor integrated circuit devices.

What is claimed is:

1. A method of manufacturing a phase shift mask used to make a semiconductor integrated circuit device, comprising:

(A) a first hole opening distribution region layout process to lay out a first hole opening distribution region having a number of first hole opening groups of a major surface of a first phase shift mask corresponding to a first hole pattern group arranged over a wafer substantially at a first pitch, by performing layout onto first layout data for the first phase shift mask using a first hole unit cell through computer processing, the first hole unit cell corresponding to each of the first hole opening groups, each first hole opening group having a first real opening and a first auxiliary opening group adjacent to and off peripheral edges of the first real opening so as to surround the first real opening, the first auxiliary opening group being substantially inverted in phase from the first real opening;

(B) a second hole opening distribution region layout process to lay out a second hole opening distribution region having a number of second hole opening groups of the major surface of the first phase shift mask corresponding to a second hole pattern group arranged over the wafer substantially at a second pitch, narrower than the first pitch, each second hole opening group having a second real opening and a second auxiliary opening group adjacent to and off peripheral edges of the second real opening so as to surround the second real opening, the second auxiliary opening group being substantially inverted in phase from the second real opening, by performing layout onto the first layout data for the first phase shift mask using the first hole unit cell through computer processing in such a way that longer sides or side portions of a pair of auxiliary openings belonging to a pair of most closely arranged hole opening groups do not face each other at close distance to the extent that the two auxiliary openings generate undesired light intensity peak on the wafer; and then (C) a first hole opening distribution region exposing process to expose the first and second hole opening distribution regions onto the major surface of the first phase shift mask according to completed first layout data or according to first mask exposure data generated from the first layout data.

2. A method according to claim 1, wherein the first hole opening groups in the first hole opening distribution region and the second hole opening groups in the second hole opening distribution region are arranged in substantially the same orientation.

3. A method according to claim 2, wherein the pair of auxiliary openings that belong to the pair of the most closely arranged hole opening groups in the second hole opening distribution region are arranged in such a way that line sections connecting the centers of the pair of the auxiliary openings face each other substantially at the front.

4. A method according to claim 3, wherein the first and second real openings are squares, and the first and second auxiliary opening groups are rectangles arranged so that their longer sides extend respectively along sides of a respective real opening.

5. A method according to claim 4, wherein any member of the first hole pattern group is arranged adjacent to all the closest neighboring members thereof.

6. A method according to claim 1, wherein any member of the first hole pattern group is arranged adjacent to all the closest neighboring members thereof.

7. A method according to claim 1, wherein the first and second real openings are square, and the first and second auxiliary opening groups are rectangular and arranged so that their longer sides extend respectively along sides of the first and second real openings.

8. A method according to claim 1, wherein the first and second real openings are so arranged that their sides are at an angle of about 45 degrees to a direction of arrangement of adjacent real openings.

9. A method according to claim 8, wherein a length of a side of a real opening is greater than a length of a side of an auxiliary opening adjacent to said side of the real opening.

10. A method according to claim 1, wherein a length of a side of a real opening is greater than a length of a side of an auxiliary opening adjacent to said side of the real opening.

11. A method according to claim 1, wherein each auxiliary opening has first and second sides respectively closest to and furthest from an adjacent real opening, and wherein corners formed by said second sides are cut off such that the second side is shorter than the first side.

12. A method according to claim 1, wherein each auxiliary opening and its adjacent real opening contact each other.

13. A method of manufacturing phase shift masks used to make a semiconductor integrated circuit device, comprising:

(A) a first hole opening distribution region layout process to lay out a first hole opening distribution region having a number of first hole opening groups of a major surface of a first phase shift mask corresponding to a first hole pattern group arranged over a wafer substantially at a first pitch, by performing layout onto first layout data for the first phase shift mask using a first hole unit cell through computer processing, the first hole unit cell corresponding to each of the first hole opening groups, each first hole opening group having a first real opening and a first auxiliary opening group adjacent to and off peripheral edges of the first real opening so as to surround the first real opening, the first auxiliary opening group being substantially inverted in phase from the first real opening;

(B) a second hole opening distribution region layout process to lay out a second hole opening distribution region having a number of second hole opening groups of a major surface of a second phase shift mask corresponding to a second hole pattern group arranged over the wafer substantially at a second pitch, narrower than the first pitch, each second hole opening group having a second real opening and a second auxiliary opening group adjacent to and off peripheral edges of the second real opening so as to surround the second real opening, the second auxiliary opening group being substantially inverted in phase from the second real opening, by performing layout onto the second layout data for the second phase shift mask using the first hole unit cell through computer processing in such a way that longer sides or side portions of a pair of auxiliary openings belonging to a pair of most closely arranged hole opening groups do not face each other at close distance to the extent that the two auxiliary openings generate undesired light intensity peak on the wafer;

(C) a first hole opening distribution region exposing process to expose the first hole opening distribution region onto the major surface of the first phase shift mask according to completed first layout data or according to first mask exposure data generated from the first layout data; and then (D) a second hole opening distribution region exposing process to expose the second hole opening distribution region onto the major surface of the second phase shift mask according to completed second layout data or according to second mask exposure data generated from the second layout data.

14. A method according to claim 13, wherein the hole opening groups in the first hole opening distribution region and the hole opening groups in the second hole opening distribution region are arranged in substantially the same orientation.

15. A method according to claim 14, wherein the pair of auxiliary openings that belong to the pair of the most closely arranged hole opening groups in the second hole opening distribution region are arranged in such a way that line sections connecting the centers of the pair of the auxiliary openings face each other substantially at the front.

16. A method according to claim 15, wherein the first and second real openings are squares, and the first and second auxiliary opening groups are rectangles arranged so that their longer sides extend respectively along sides of respective first and second real openings.

17. A method according to claim 16, wherein any member of the first hole pattern group is arranged adjacent to all closest neighboring members thereof.

18. A method according to claim 3, wherein any member of the first hole pattern group is arranged adjacent to all the closest neighboring members thereof.

19. A method according to claim 3, wherein the first and second real openings are square, and the first and second auxiliary opening groups are rectangular and arranged so that their longer sides extend respectively along sides of the first and second real openings.

* * * * *